(12) United States Patent
Moon et al.

(10) Patent No.: US 12,348,259 B2
(45) Date of Patent: Jul. 1, 2025

(54) ELECTRONIC DEVICE AND METHOD FOR CONTROLLING POWER SUPPLIED TO TRANSMIT SIGNAL

(71) Applicant: SAMSUNG ELECTRONICS CO., LTD., Suwon-si (KR)

(72) Inventors: John Moon, Suwon-si (KR); Hyoseok Na, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 429 days.

(21) Appl. No.: 18/049,135

(22) Filed: Oct. 24, 2022

(65) Prior Publication Data
US 2023/0081582 A1 Mar. 16, 2023

Related U.S. Application Data

(63) Continuation of application No. PCT/KR2022/013619, filed on Sep. 13, 2022.

(30) Foreign Application Priority Data

Sep. 16, 2021 (KR) .................. 10-2021-0124362

(51) Int. Cl.
*H04B 1/40* (2015.01)
*H03F 3/24* (2006.01)

(52) U.S. Cl.
CPC .............. *H04B 1/40* (2013.01); *H03F 3/24* (2013.01); *H03F 2200/165* (2013.01); *H03F 2200/171* (2013.01); *H03F 2200/451* (2013.01)

(58) Field of Classification Search
CPC ....... H04B 1/40; H03F 3/24; H03F 2200/165; H03F 2200/171; H03F 2200/451;
(Continued)

(56) References Cited

U.S. PATENT DOCUMENTS

| 9,899,962 B2 | 2/2018 | Takenaka |
| 10,187,137 B2 * | 1/2019 | Weissman ............ H04B 1/0483 |
| 11,088,720 B2 * | 8/2021 | Sakurai .................... H04B 1/48 |

(Continued)

FOREIGN PATENT DOCUMENTS

| JP | 11-150495 A | 6/1999 |
| JP | 3059892 B2 | 7/2000 |

(Continued)

OTHER PUBLICATIONS

International Search Report (PCT/ISA/210) issued from the International Searching Authority on Dec. 26, 2022 to International Application No. PCT/KR2022/013619.
(Continued)

*Primary Examiner* — Kabir A Timory
(74) *Attorney, Agent, or Firm* — Sughrue Mion, PLLC

(57) ABSTRACT

An electronic device includes an antenna, a communication circuit, and a processor. The communication circuit includes a first amplifier configured to amplify a radio frequency signal; a first coupler configured to output a first amplifier output signal output from the first amplifier, to the antenna through a first port, and output at least a part of the first amplifier output signal to a first switch through a second port; and a second amplifier configured to amplify the second portion of the first amplifier output signal, output from the first switch. The processor is operably connected to the antenna and the communication circuit, wherein the processor is configured to, based on a magnitude of the first amplifier output signal, control the first switch and the second switch to use the first amplifier, or to use the first amplifier and the second amplifier.

20 Claims, 12 Drawing Sheets

(58) Field of Classification Search
CPC .... H03F 3/72; H03F 2200/105; H03F 1/0277; H03F 3/195; H03F 3/211; H03F 3/245
See application file for complete search history.

(56) References Cited

U.S. PATENT DOCUMENTS

| | | |
|---|---|---|
| 11,114,987 B2 | 9/2021 | Hinrichsen et al. |
| 11,652,504 B2 | 5/2023 | Thompson |
| 2006/0057980 A1* | 3/2006 | Haque .................. H03F 3/24 455/127.1 |
| 2015/0249444 A1 | 9/2015 | Shin et al. |
| 2017/0033747 A1 | 2/2017 | Balteanu et al. |
| 2018/0331704 A1 | 11/2018 | Xie |
| 2018/0367168 A1 | 12/2018 | Lee et al. |
| 2020/0127698 A1 | 4/2020 | Cho et al. |
| 2020/0127742 A1 | 4/2020 | Seong et al. |

FOREIGN PATENT DOCUMENTS

| | | |
|---|---|---|
| JP | 4521806 B2 | 8/2010 |
| KR | 10-2012-0081752 A | 7/2012 |
| KR | 10-2018-0137765 A | 12/2018 |
| KR | 10-1941079 B1 | 1/2019 |
| KR | 10-2019-0012675 A | 2/2019 |
| KR | 10-2020-0043735 A | 4/2020 |

OTHER PUBLICATIONS

Notification Concerning Availability of the Publication of the International Application (PCT/IB/311) issued from the International Bureau of WIPO on Mar. 23, 2023 to International Application No. PCT/KR2022/013619.

* cited by examiner

ELECTRONIC DEVICE AND METHOD FOR CONTROLLING POWER SUPPLIED TO TRANSMIT SIGNAL

CROSS-REFERENCE TO RELATED APPLICATIONS

This application is a continuation application of International Application No. PCT/KR2022/013619, filed Sep. 13, 2022, which claims priority to Korean Patent Application No. 10-2021-0124362, filed with the Korean Intellectual Property Office on Sep. 16, 2021, the disclosures of which are herein incorporated by reference in their entireties.

BACKGROUND

1. Field

The disclosure relates to an electronic device and a method for controlling power supplied to a transmission signal.

2. Description of Related Art

To meet the continuously increasing demand for wireless data traffic, efforts have been made to develop a wireless communication system for supporting a higher data rate. Supporting high data transmission rates requires wide signal bandwidths and complicates signal modulation schemes, thereby increasing maximum power required in an electronic device. A power amplifier, which consumes a large amount of power in the electronic device, is being developed to have high-efficiency and high-linearity characteristics.

Recently, a mobile communication environment such as $5^{th}$ generation (5G) requires high transmission power (e.g., power class 2). To effectively supply high transmission power, an electronic device may not only require enhanced performance of a power amplifier, but also an increase in the number of amplifiers or an increase in the magnitude of the power amplifier. When the magnitude of the power amplifier is designed to be high, a gain in efficiency may be acquired in a situation where maximum output power is required, but in a situation where no maximum output power is required, power efficiency may be reduced or current consumption may occur. When multiple power amplifiers are used, a Tx line for connecting a transmission circuit and a transceiver is added, which may occupy a large space of a mounting area or cause an increase in current consumption of the transceiver.

Various embodiments provide a device and a method for including multiple amplifiers in a transmission circuit connected to a transceiver (e.g., an RFIC), and designing a circuit so that a signal coupled to a first amplifier is used as an input of a second amplifier, and performing control to use the first amplifier only, or control to use both the first amplifier and the second amplifier, according to the signal to be transmitted.

SUMMARY

According to an aspect of an example embodiment, provided is an electronic device including an antenna, a communication circuit including a first amplifier configured to amplify a radio frequency signal to be transmitted through the antenna, a first coupler connected to the first amplifier and configured to output a first amplifier output signal output from the first amplifier, to the antenna through a first port of the first coupler, and output at least a part of the first amplifier output signal to a first switch through a second port of the first coupler, the first switch connected to the second port of the first coupler and configured to switch the at least a part of the first amplifier output signal, output from the second port of the first coupler, to a second amplifier or a second switch, and the second amplifier configured to amplify the at least a part of the first amplifier output signal, output from the first switch, and a processor operably connected to the antenna and the communication circuit, wherein the processor is configured to, based on a magnitude of the first amplifier output signal, control the first switch and the second switch to the first amplifier, or to use the first amplifier and the second amplifier.

According to an aspect of an example embodiment, provided is a communication circuit including a transmission circuit configured to amplify a radio frequency signal to be transmitted through an antenna of an electronic device, and a reception circuit configured to amplify a radio frequency signal received from the antenna, the communication circuit including: a first amplifier configured to amplify a radio frequency signal to be transmitted through the antenna, a first coupler connected to the first amplifier and configured to output a first amplifier output signal output from the first amplifier to the antenna through a first port of the first coupler and output at least a part of the first amplifier output signal to a first switch through a second port of the first coupler, the first switch connected to the second port of the first coupler and configured to switch the at least a part of the first amplifier output signal, output from the second port of the first coupler, to a second amplifier or a second switch, and the second amplifier configured to amplify the at least a part of the first amplifier output signal, output from the first switch.

According to an aspect of an example embodiment, provided is an operation method of an electronic device, the method including: monitoring a magnitude of a radio frequency signal output through an antenna of the electronic device, and controlling a first amplifier included in a communication circuit of the electronic device to be used, or controlling the first amplifier and a second amplifier included in the communication circuit to be used, based on the magnitude of the output radio frequency signal, wherein the communication circuit includes the first amplifier configured to amplify a radio frequency signal to be transmitted through the antenna, a first coupler connected to the first amplifier and configured to output a first amplifier output signal output from the first amplifier, to the antenna through a first port of the first coupler, and output at least a part of the first amplifier output signal to a first switch through a second port of the first coupler, the first switch connected to the second port of the first coupler and configured to switch the at least a part of the first amplifier output signal, output from the second port of the first coupler, to a second amplifier or a second switch, and the second amplifier configured to amplify the at least a part of the first amplifier output signal, output from the first switch.

According to various embodiments, a transmission circuit connected to a transceiver may include multiple amplifiers, wherein a circuit is designed so that a signal coupled to a first amplifier is used as an input of a second amplifier, and control is performed according to the amplified signal to use the first amplifier only, or to use both the first amplifier and the second amplifier, whereby transmission power may be effectively controlled.

According to various embodiments, when high (or maximum) transmission power is required, control is performed to use both the first amplifier and the second amplifier, whereby output at maximum transmission power may be performed using two amplifiers included in one transmission circuit.

According to various embodiments, one transmission circuit may include two amplifiers so that the transmission circuit may output maximum transmission power while not increasing a line connected to a transceiver.

According to various embodiments, control is performed so that only a first amplifier is used when low transmission power (e.g., a reference value or less) is required, and both the first amplifier and a second amplifier are used when high transmission power (e.g., greater than a reference value) is required, whereby a transmission circuit having a new structure enabling outputting at maximum transmission power while reducing current consumption may be designed.

BRIEF DESCRIPTION OF DRAWINGS

Embodiments of the inventive concept will be more clearly understood from the following detailed description taken in conjunction with the accompanying drawings.

DETAILED DESCRIPTION

Figure 1:
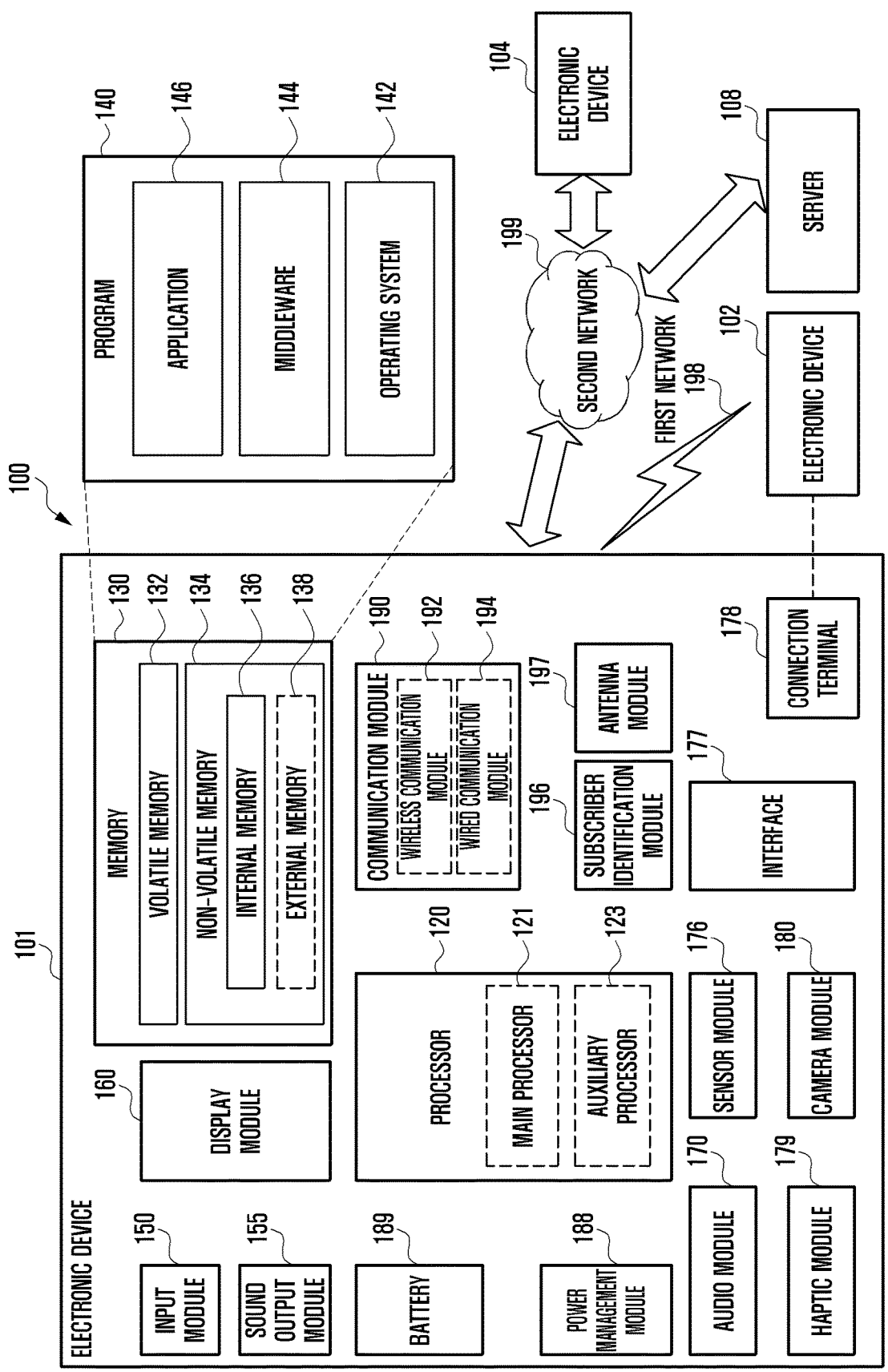
FIG. 1 is a block diagram illustrating an electronic device in a network environment according to various embodiments.

FIG. 1 is a block diagram illustrating an electronic device 101 in a network environment 100 according to certain embodiments.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5th generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4th generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to certain embodiments, the antenna module 197 may form a mmWave antenna module. According to an embodiment, the mmWave antenna module may include a printed circuit board, an RFIC disposed on a first surface (e.g., the bottom surface) of the PCB, or adjacent to the first surface and capable of supporting a designated high-frequency band (e.g., the mmWave band), and a plurality of antennas (e.g., array antennas) disposed on a second surface (e.g., the top or a side surface) of the PCB, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an Internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to certain embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that certain embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities, and some of the multiple entities may be separately disposed in different components. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

Figure 2A:
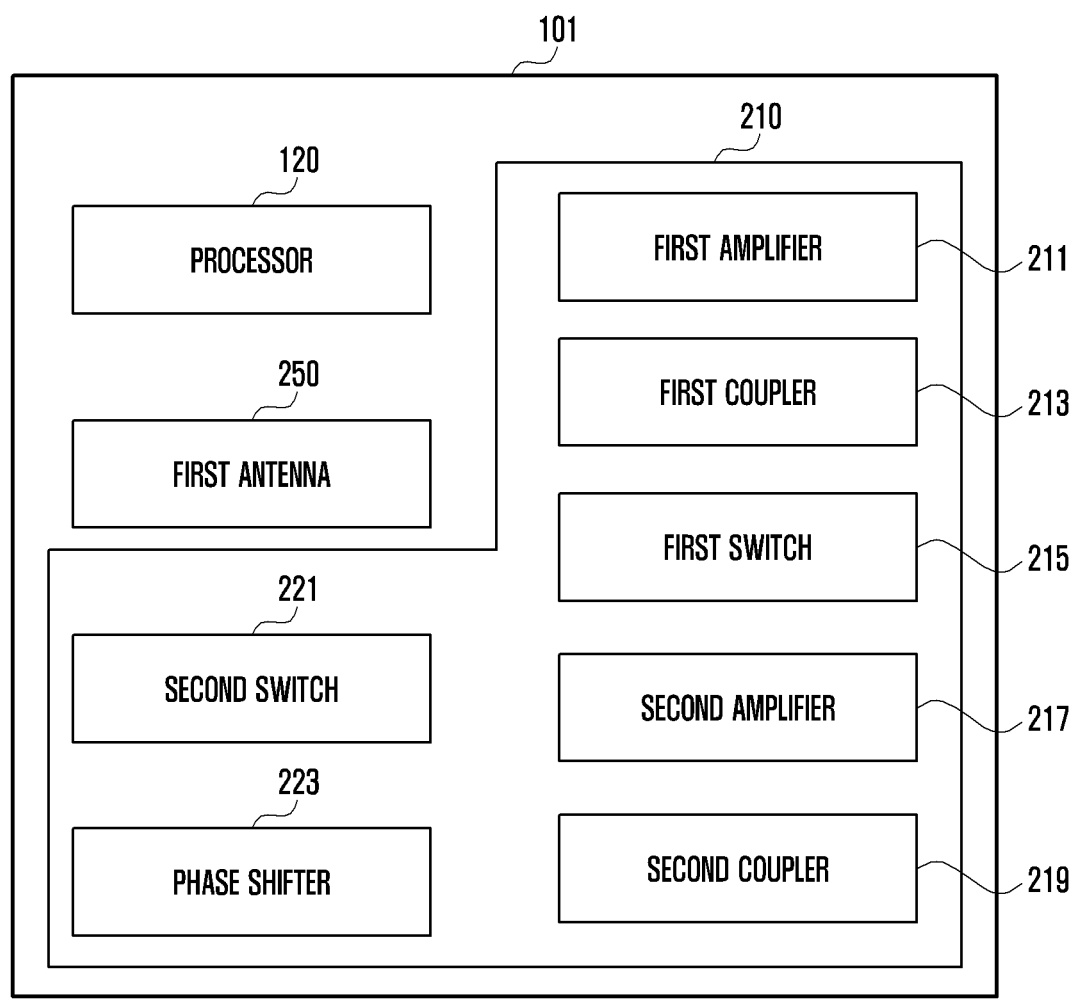
FIGS. 2A and 2B illustrate configurations including multiple amplifiers in a transmission circuit of an electronic device according to various embodiments.
Figure 2B:
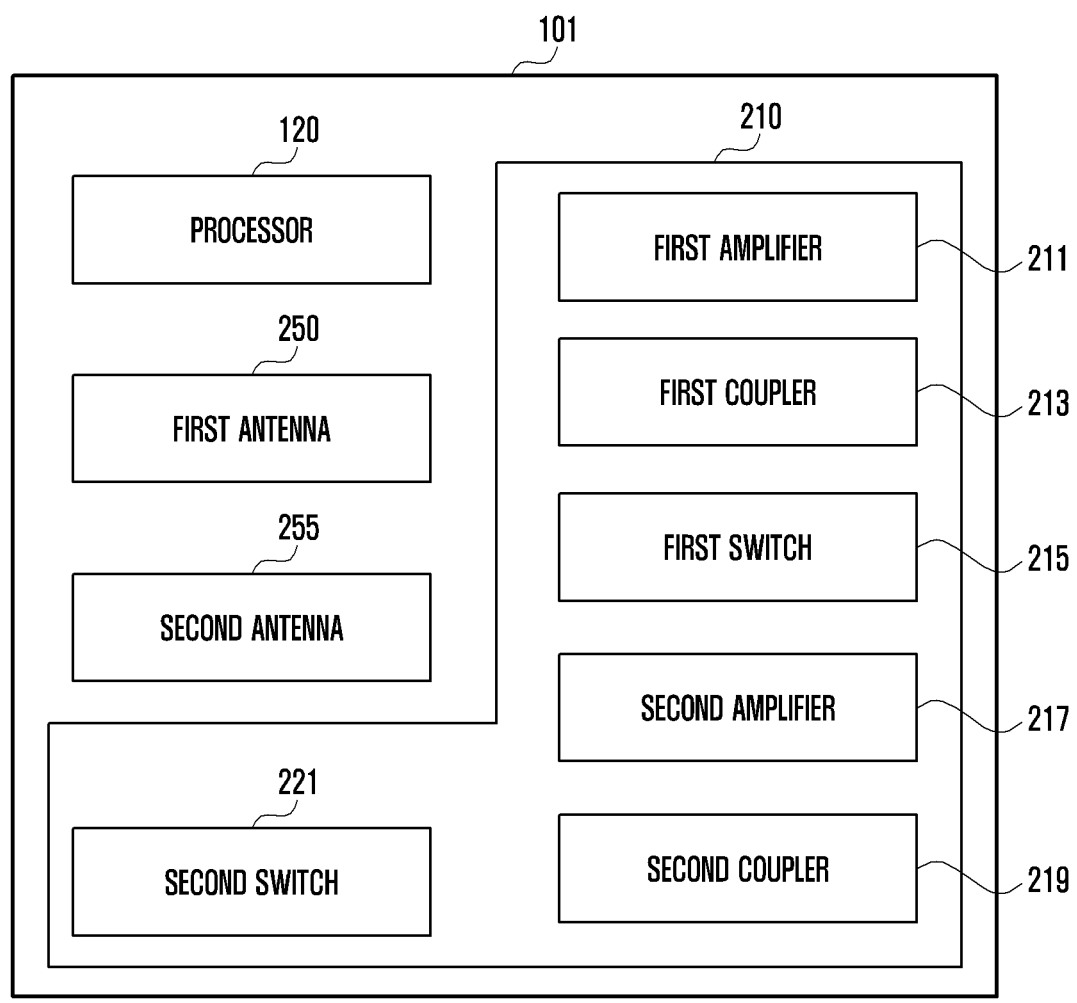

FIGS. 2A and 2B illustrate configurations including multiple amplifiers in a transmission circuit of an electronic device according to various embodiments.

FIG. 2A illustrates a configuration including multiple amplifiers in a transmission circuit of an electronic device according to various embodiments.

Referring to FIG. 2A, an electronic device (e.g., the electronic device 101 of FIG. 1) according to various embodiments may include at least one of a processor (e.g., the processor 120 of FIG. 1), a first antenna 250 (e.g., the antenna module 197 of FIG. 1), or a transmission circuit 210. FIG. 2A illustrates a processor 120, but the processor 120 may mean a communication processor included in a communication module (e.g., the communication module 190 of FIG. 1). The transmission circuit 210 may amplify a radio frequency signal to be transmitted through the first antenna 250 upon control by the processor 120. Although not shown, the transmission circuit 210 is included in a communication circuit (e.g., a communication circuit 330 of FIG. 3), and the communication circuit may be connected to a transceiver (e.g., the transceiver 310 of FIG. 3 and a radio frequency integrated circuit (RFIC)). The communication circuit may include the transmission circuit 210 and a reception circuit, wherein the reception circuit may amplify a radio frequency signal received through the first antenna 250 and transfer the same to the transceiver.

According to an embodiment, the transmission circuit 210 may include at least one of a first amplifier 211, a first coupler 213, a first switch 215, a second amplifier 217, a second coupler 219, a second switch 221, or a phase shifter 223. The first amplifier 211 may acquire a radio frequency signal (hereinafter, referred to as an "RF signal") to be transmitted from the transceiver through the antenna 250, and amplify the acquired RF signal. The RF signal input to the first amplifier 211 may have the same frequency as an RF signal output from the first amplifier 211, and the magnitude (power) of the RF signal may increase through the first amplifier 211.

Hereinafter, a signal input to the first amplifier 211 may be referred to as an "RF signal", and a signal output from the first amplifier 211 may be referred to as an "amplified RF signal (or a first amplifier output signal)". The first amplifier 211 may amplify the RF signal by using power (e.g., a fixed power voltage) supplied from a power management module (e.g., the power management module 188 of FIG. 1) of the electronic device 101. According to various embodiments, at least one of an envelope tracking (ET) technology (or algorithm), an average power tracking (APT) technology, or a step power tracking (SPT) technology may be applied to the first amplifier 211.

According to various embodiments, the ET technology corresponds to a technology of providing a voltage (or power) to the first amplifier 211 and reducing power consumption of the first amplifier 211, based on an envelope of the RF signal input to an amplifier (e.g., the first amplifier 211). The ET technology corresponds to tracking of the envelope of the RF signal by a voltage (Vcc) applied to the first amplifier 211, and may reduce (or increase power efficiency of the first amplifier 211) waste of power of the first amplifier 211 to operate the first amplifier 211. The APT technology or the SPT technology may be used to change the voltage supplied to the first amplifier 211 to reduce the power consumption of the amplifier (e.g., the first amplifier 211). When the ET technology is not applied to the first amplifier 211, the APT technology or the SPT technology may be applied. To apply at least one of the ET technology, the APT technology, or the SPT technology to the first amplifier 211, the electronic device 101 may further include a power supplier (e.g., a first power supplier 370 of FIG. 3).

The amplified RF signal may be input to the first coupler 213. According to various embodiments, the amplified RF signal may be input to the first coupler 213 through a first filter (e.g., a first filter 411 of FIGS. 4A to 4C). The first filter 411 may be disposed between the first amplifier 211 and the first coupler 213, and may filter the RF signal amplified by the first amplifier 211. The first coupler 213 may be a radio frequency (RF) passive element distributing the amplified RF signal. The first coupler 213 may output (or transfer) most (or a first portion) of the amplified RF signal to a first port and output a partial signal (or a second portion of the amplified RF signal) to (or may be coupled to) a second port. The signal output to the first port of the first coupler 213 may be input to the first antenna 250, and the signal output to the second port of the first coupler 213 may be input to the first switch 215 to be used for power measurement of the transceiver. The signal input to the first antenna 250 may be output (or propagated) to the outside.

According to an embodiment, the processor 120 may determine whether to use the first amplifier 211 (e.g., use the first amplifier 211 only) or use the first amplifier 211 and the second amplifier 217, based on the magnitude (or the magnitude of power) of the RF signal (e.g., the amplified RF signal) output through the first antenna 250. The processor 120 may determine to use the first amplifier 211 when the power (or the magnitude of the power) of the output RF signal is equal to or less than a reference value, and determine to use the first amplifier 211 and the second amplifier 217 when the power (or the magnitude of the power) of the output RF signal is greater than a reference value. The power of the output RF signal, which is equal to or less than the reference value, may mean transmission of a transmission signal at low transmission power. The power of the output RF signal, which is greater than the reference value, may mean transmission of a transmission signal at high transmission power.

According to an embodiment, the processor 120 may control the first switch 215 and the second switch 221, based on the determined amplifier (or the number of amplifiers). The transmission output power corresponding to the magnitude of the power of the output RF signal may be stored in a memory (e.g., the memory 130 of FIG. 1). The memory 130 may include a signal control table, wherein the signal control table may include transmission output value (or a code value) corresponding to the magnitude of the power of the output RF signal.

According to an embodiment, the first switch 215 may be disposed in a line output from the second port of the first coupler 213, and the second switch 221 may be disposed in an input line of the transceiver. In an embodiment, the first switch 215 may include one input port and two output ports. For example, the input port of the first switch 215 may be connected to the second port of the first coupler 213. One of the two output ports of the first switch 215 may be selectively connected to the input port of the second amplifier 217 or the input port of the second switch 221. In an embodiment, the second switch 221 may include two input ports and one output port. For example, one of the two input ports of the second switch 221 may be selectively connected to one of the two output ports of the first switch 215 or a second port of the second coupler 219. An output port of the second switch 221 may be connected to the input port of the transceiver.

According to an embodiment, the processor 120 may determine a first transmission path when the first amplifier 211 is used (e.g., when only the first amplifier 211 is used), and control the first switch 215 and the second switch 221, based on the first transmission path. For example, in the first transmission path, the first switch 215 may be switched so that the signal output to the second port of the first coupler 213 is input to the second switch 221. In the first transmission path, the second switch 221 may be switched so that the signal transferred from the first switch 215 is output. The signal output from the second switch 221 may be input to the transceiver.

The transceiver may control the magnitude of power of an RF signal input to the first amplifier 221, based on the signal output from the second switch 221. Alternatively, the transceiver may transfer the signal output from the second switch 221, to the processor 120, and the processor 120 may control the magnitude of power of the RF signal input to the first amplifier 211, based on the signal output from the second switch 221. The processor 120 may transfer a control signal for controlling the magnitude of power of the RF signal input to the first amplifier 221 to the transceiver, and the transceiver may input the RF signal according to the control signal to the first amplifier 211.

According to an embodiment, when the first amplifier 211 and the second amplifier 217 are used, the processor 120 may control the signal output from the second port of the first coupler 213 to be input to the second amplifier 217. When the first amplifier 211 and the second amplifier 217 are used, the processor 120 may determine a second transmission path, and control the first switch 215 and the second switch 221, based on the second transmission path. For example, in the second transmission path, the first switch 215 may be switched so that the signal output from the second port of the first coupler 213 is input to the second amplifier 217.

Figure 4A:
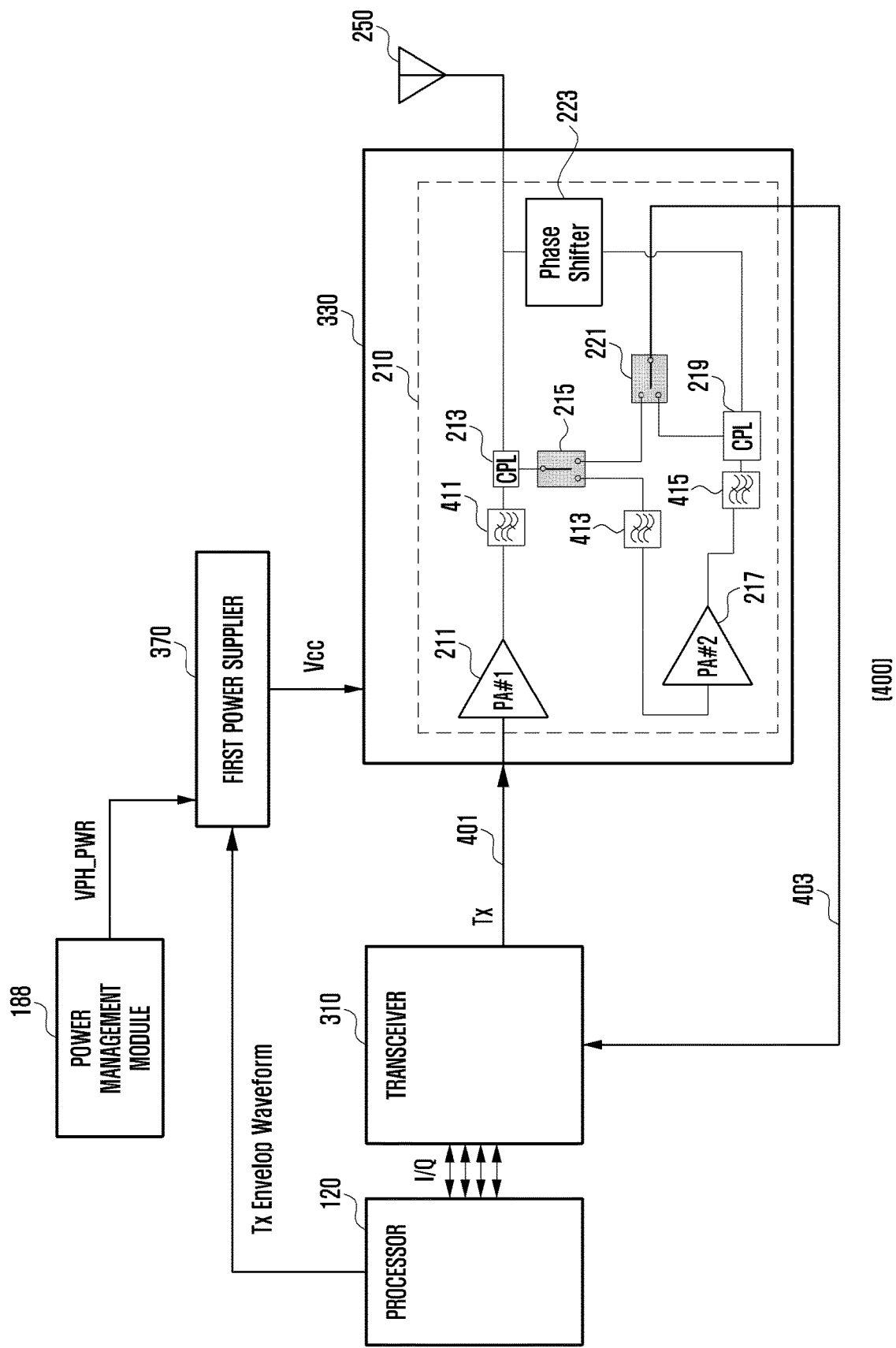
FIGS. 4A to 4C are circuit diagrams related to communication of an electronic device according to various embodiments.
Figure 4B:
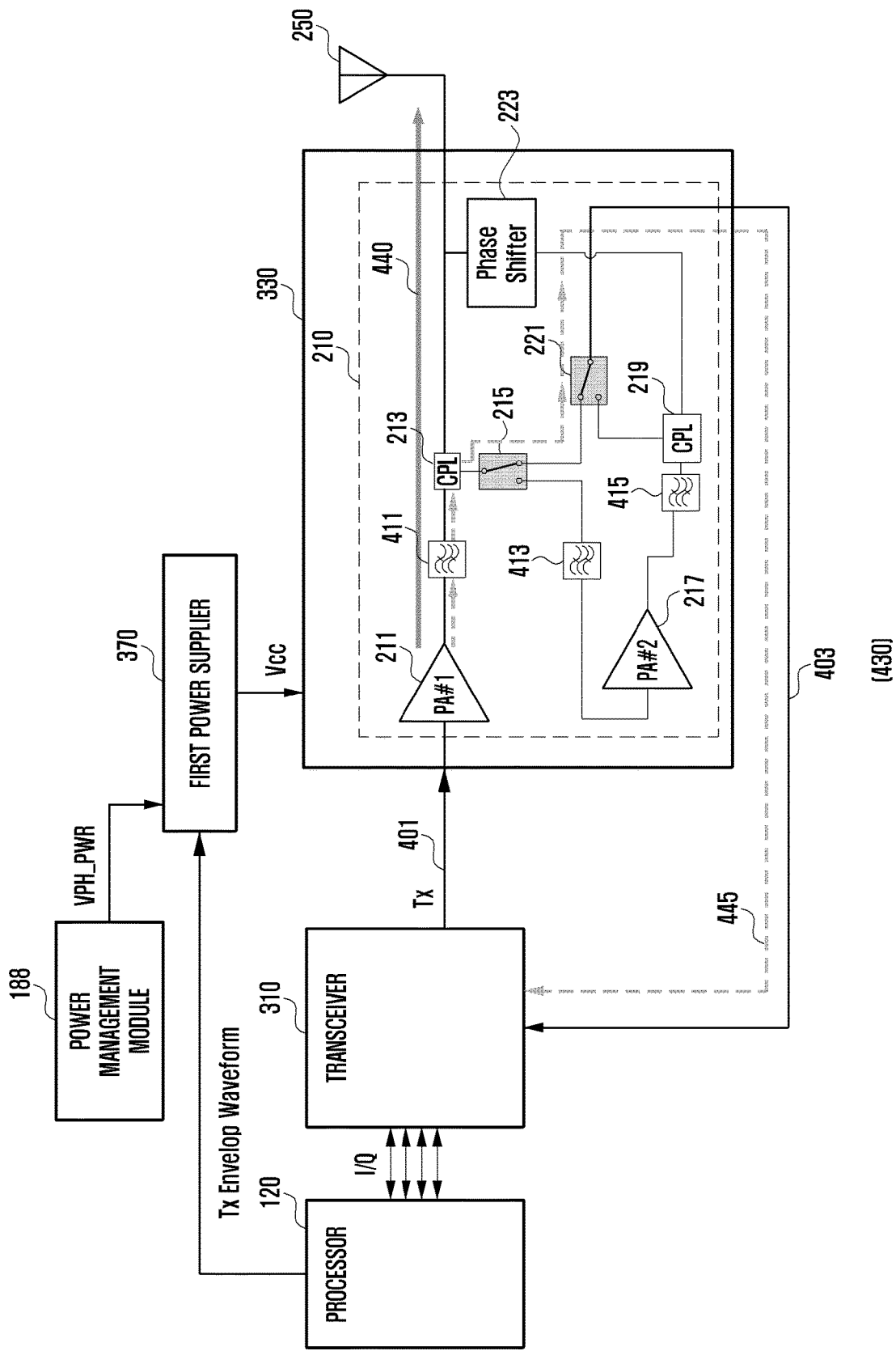
Figure 4C:
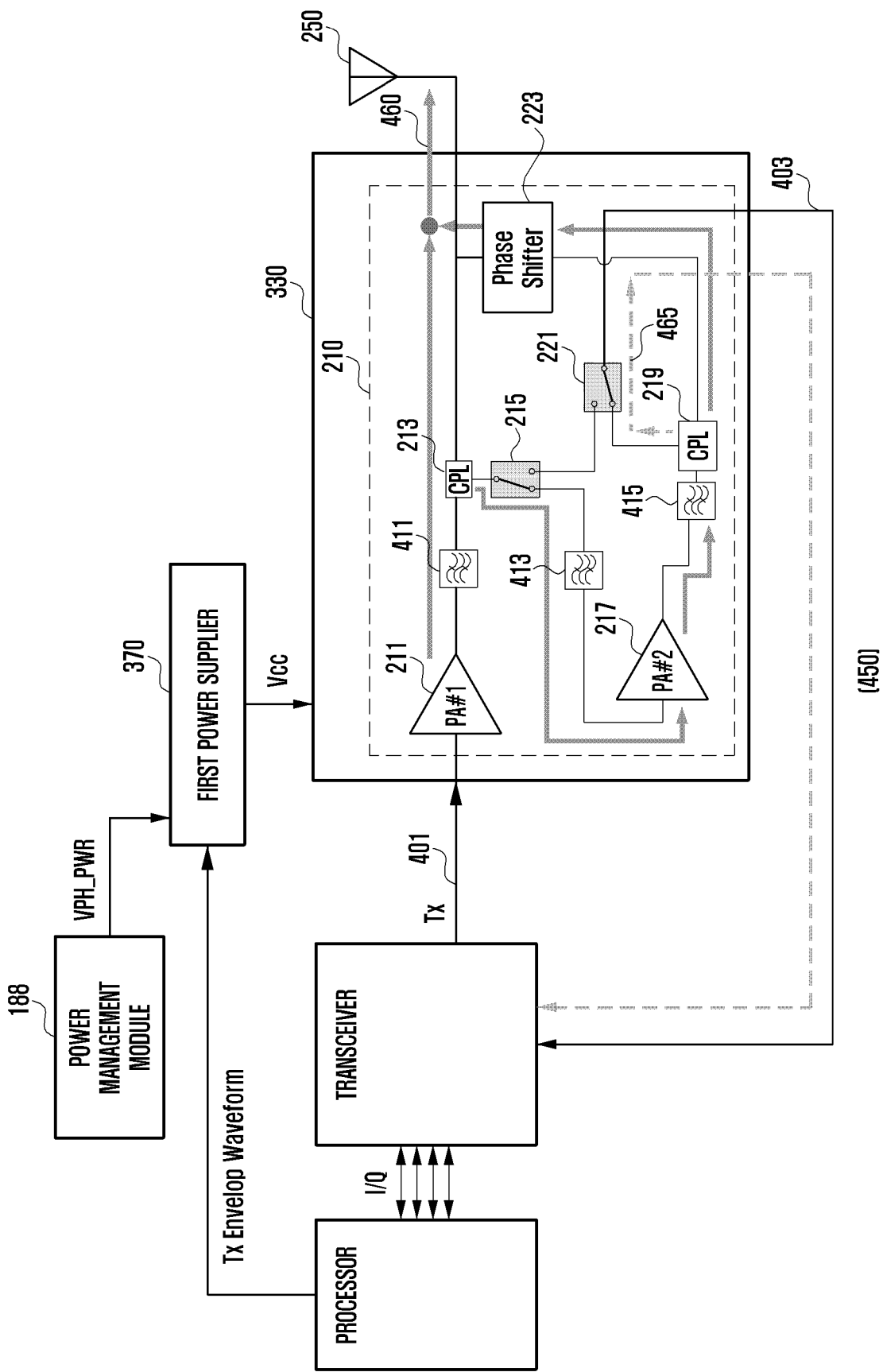

According to various embodiments, the signal output from the second port may be input to the first switch 215, and the output of the first switch 215 may be input to the second amplifier 217 through a second filter (e.g., a second filter 413 of FIGS. 4A to 4C). The second filter 413 may be disposed between the first switch 215 and the second amplifier 217, and filter the signal output from the first switch 215 (e.g., the signal output to the second port of the first coupler 213). According to the implementation of the electronic device 101 in various embodiments, the second filter 413 may be omitted. The second amplifier 217 may acquire the signal output from the second port (e.g., the output of the first switch 215), and amplify the acquired signal. Hereinafter, the RF signal amplified through the first amplifier 211 may be a first amplifier output signal, and the RF signal amplified through the second amplifier 217 may be a second amplifier output signal.

The second amplifier output signal may be input to the second coupler 219. According to various embodiments, the second amplifier output signal may be input to the second coupler 219 through a third filter (e.g., a third filter 415 of FIGS. 4A to 4C). The third filter 415 may be disposed between the second amplifier 217 and the second coupler 219, and filter the RF signal amplified by the second amplifier 217 (e.g., the second amplifier output signal). The second coupler 219 may output most (or a first portion) of the second amplifier output signal to the first port of the second coupler 219, and output at least a part (or a second portion) of the second amplifier output signal to the second port of the second coupler 219. The signal output from the first port of the second coupler 219 may be input to the phase shifter 223, and the signal output from the second port of the second coupler 219 may be input to the second switch 221 to be used for power measurement of the transceiver. In the second transmission path, the second switch 221 may be switched so that the signal output from the second port of the second coupler 219 is output to the transceiver. The signal output from the second switch 221 may be input to the transceiver.

According to an embodiment, the phase of the second amplifier output signal, input to the phase shifter 223, may be shifted. The first amplifier output signal may correspond to an RF signal amplified through the first amplifier 211, and the second amplifier output signal may correspond to an RF signal amplified through the second amplifier 217, and thus at least a part of (or entire) signal may be attenuated when the first amplifier output signal and the second amplifier output signal are combined. The second amplifier 217 is used together with the first amplifier 211 to increase transmission output power. When the first amplifier output signal is attenuated by the second amplifier output signal, the transmission output power may not be increased. The phase shifter 223 may shift the phase of the second amplifier output signal to prevent the first amplifier output signal from being attenuated by the second amplifier output signal. The signal output from the phase shifter 223 may be combined with the first amplifier output signal and input to the first antenna 250. The signal input to the first antenna 250 (e.g., first amplifier output signal+second amplifier output signal) may be output (or propagated) to the outside.

FIG. 2B illustrates another configuration including multiple amplifiers in a transmission circuit of an electronic device according to various embodiments.

Referring to FIG. 2B, an electronic device 101 may include at least one of a processor 120, a first antenna 250, a second antenna 255 (e.g., the antenna module 197 of FIG. 1), or a transmission circuit 210. As compared to the configuration in FIG. 2A, the configuration in FIG. 2B may be identical or similar to that in FIG. 2A except for not including a phase shifter 223 and further including the second antenna 255. The description of elements identical or similar to those in FIG. 2A will be made in FIG. 2B. The transmission circuit 210 may include at least one of a first amplifier 211, a first coupler 213, a first switch 215, a second amplifier 217, a second coupler 219, or a second switch 221.

The first amplifier 211 may acquire an RF signal to be transmitted through the antenna 250 from the transceiver, and amplify the acquired RF signal. Hereinafter, the signal input to the first amplifier 211 may be referred to as an "RF signal", and the signal output from the first amplifier 211 may be referred to as an "amplified RF signal (or a first amplifier output signal)". The first amplifier 211 may amplify the RF signal by using power (e.g., a fixed power voltage) supplied from the power management module 188 of the electronic device 101. To apply at least one of the ET technology, the APT technology, or the SPT technology to the first amplifier 211, the electronic device 101 may further include a first power supplier 370.

The amplified RF signal (e.g., the first amplifier output signal) may be input to the first coupler 213. According to various embodiments, the amplified RF signal may be input to the first coupler 213 through the first filter 411. The first coupler 213 may output most of the amplified RF signal to a first port, and output at least a part of the amplified RF signal coupled to the first coupler 213 to a second port. The signal output from the first port of the first coupler 213 may be input to the first antenna 250, and the signal output from the second port of the first coupler 213 may be input to the first switch 215 to be used for power measurement of the transceiver. The signal input to the first antenna 250 (e.g., the first amplifier output signal) may be output (or propagated) to the outside.

According to an embodiment, the processor 120 may determine whether to use the amplifier 211 or use the first amplifier 211 and the second amplifier 217, based on the magnitude (or the magnitude of power) of the RF signal (e.g., the amplified RF signal) output through the first antenna 250 or the second antenna 255. The processor 120 may determine to use the first amplifier 211 when the power (or the magnitude of the power) of the output RF signal is equal to or less than a reference value, and determine to use the first amplifier 211 and the second amplifier 217 when the power (or the magnitude of the power) of the output RF signal is greater than a reference value. The processor 120 may control the first switch 215 and the second switch 221, based on the determined amplifier (or the number of amplifiers). The transmission output power corresponding to the magnitude of the power of the output RF signal may be stored in the memory 130. The memory 130 may include a signal control table, wherein the signal control table may include transmission output value (or a code value) corresponding to the magnitude of the power of the output RF signal.

According to an embodiment, the first switch 215 may be disposed in a line output from the second port of the first coupler 213, and the second switch 221 may be disposed in an input line of the transceiver. The first switch 215 may include one input port and two output ports. For example, the input port of the first switch 215 may be connected to a second port of the first coupler 213. A first output port of the first switch 215 may be connected to the input port of the second amplifier 217, and a second output port of the first switch 215 may be connected to an input port of the second switch 221. The second switch 221 may include two input ports and one output port. A first input port of the second switch 221 may be connected to a second output port of the first switch 215, and a second input port of the second switch 221 may be connected to a second port of the second coupler 219. An output port of the second switch 221 may be connected to the input port of the transceiver.

According to an embodiment, the processor 120 may determine a first transmission path when the first amplifier 211 is used, and control the first switch 215 and the second switch 221, based on the first transmission path. For example, in the first transmission path, the first switch 215 may be switched so that the signal output from the second port of the first coupler 213 is input to the second switch 221. In the first transmission path, the second switch 221 may be switched so that the signal transferred from the first switch 215 is output. The signal output from the second switch 221 may be input to the transceiver. When the first amplifier 211 is used, the signal output from the first port of the first coupler 213 (e.g., the first amplifier signal) may be output (or propagated) to the outside through the first antenna 250.

According to an embodiment, when the first amplifier 211 and the second amplifier 217 are used, the processor 120 may control the signal output from the second port of the first coupler 213 to be input to the second amplifier 217. When the first amplifier 211 and the second amplifier 217 are used, the processor 120 may determine a second transmission path, and control the first switch 215 and the second switch 221, based on the second transmission path. For example, in the second transmission path, the first switch 215 may be switched so that the signal output from the second port of the first coupler 213 is input to the second amplifier 217. When the first amplifier 211 and the second amplifier 217 are used, the signal output from the first port of the first coupler 213 (e.g., the first amplifier output signal) may be output (or propagated) to the outside through the first antenna 250.

According to various embodiments, the signal output from the second port may be input to the first switch 215, output from a first output port of the first switch 215, and input to the second amplifier 217 through a second filter 413. According to the implementation of the electronic device 101 in various embodiments, the second filter 413 may be omitted. The second amplifier 217 may acquire the signal output from the second port, and amplify the acquired signal. The RF signal amplified through the first amplifier 211 may be a first amplifier output signal, and the RF signal amplified through the second amplifier 217 may be a second amplifier output signal.

Figure 5:
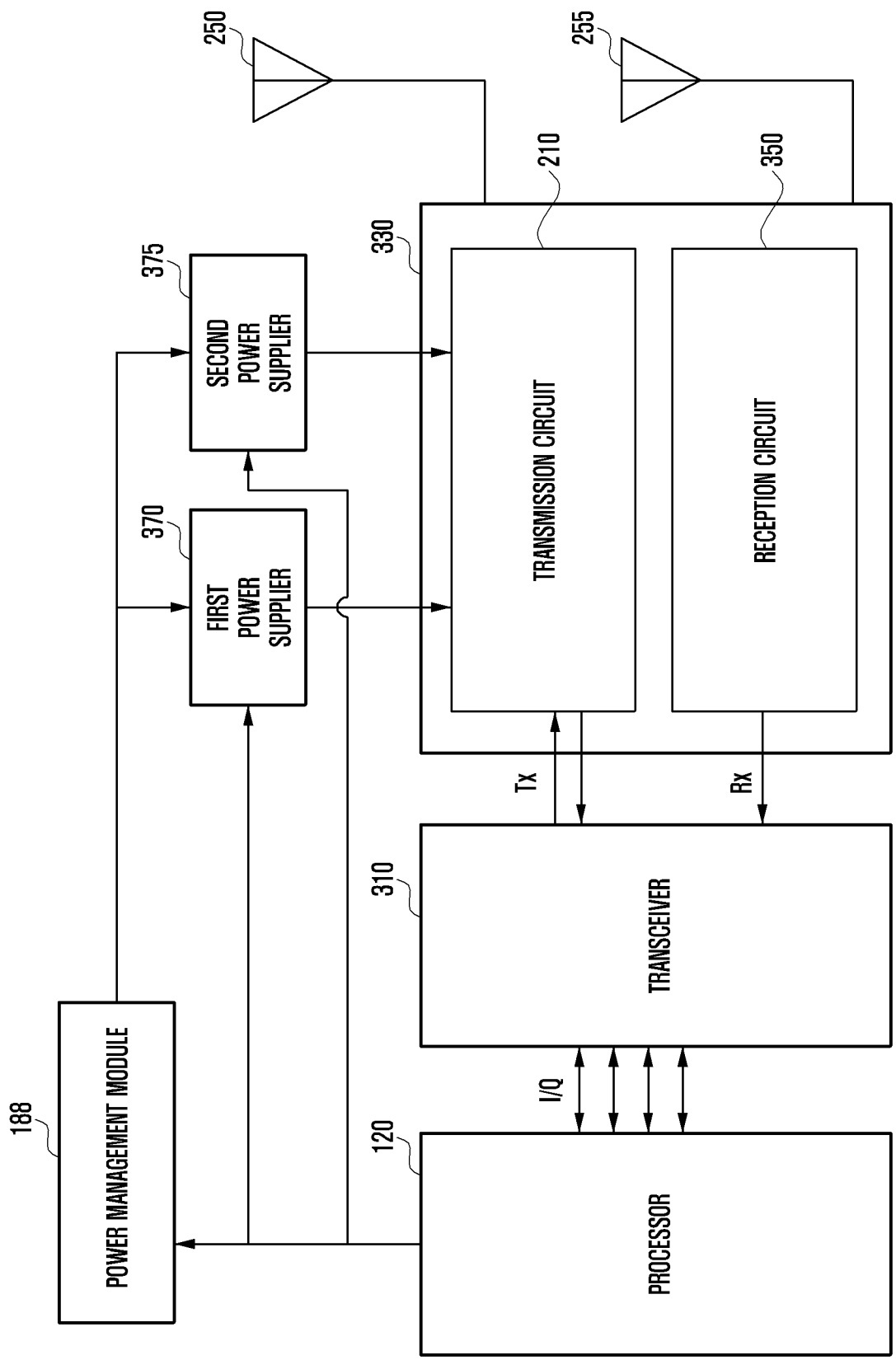
FIG. 5 illustrates a configuration related to communication of an electronic device according to various embodiments.

According to various embodiments, to apply at least one of the ET technology, the APT technology, or the SPT technology to the second amplifier 217, the electronic device 101 may further include a second power supplier (e.g., a second power supplier 375 of FIG. 5). When the first amplifier 211 and the second amplifier 217 are used, the second power supplier 375 may apply at least one of the ET technology, the APT technology, or the SPT technology to the second amplifier 217. The first power supplier 370 and the second power supplier 375 may operate upon the control by the processor 120, and thus the ET technology may be applied without a timing issue between an envelope of an RF signal (e.g., a signal transferred from the transceiver) input to the first amplifier 211 and an envelope of an RF signal (e.g., a signal output to the second port of the first coupler 213) input to the second amplifier 217.

The second amplifier output signal may be input to the second coupler 219. According to various embodiments, the second amplifier output signal may be input to the second coupler 219 through the third filter 415. The second coupler 219 may output most of the second amplifier output signal to a first port, and output at least a part of the second amplifier output signal to a second port. The signal output from the first port of the second coupler 219 may be input to the second antenna 255, and the signal output from the second port of the second coupler 219 may be input to the second switch 221 to be used for power measurement of the transceiver. In the second transmission path, the second switch 221 may be switched so that the signal output from the second port of the second coupler 219 is output. The signal output from the second switch 221 may be input to the transceiver. The signal input to the second antenna 255 (e.g., the second amplifier output signal) may be output (or propagated) to the outside. When the first amplifier 211 and the second amplifier 217 are used, the signal output to the first port of the second coupler 219 (e.g., the second amplifier output signal) may be output (or propagated) to the outside through the second antenna 255.

In FIG. 2B, the first amplifier output signal and the second amplifier output signal are not combined, and the first amplifier output signal is output to the outside through the first antenna 250, and the second amplifier output signal may be output to the outside through the second antenna 255.

Figure 3:
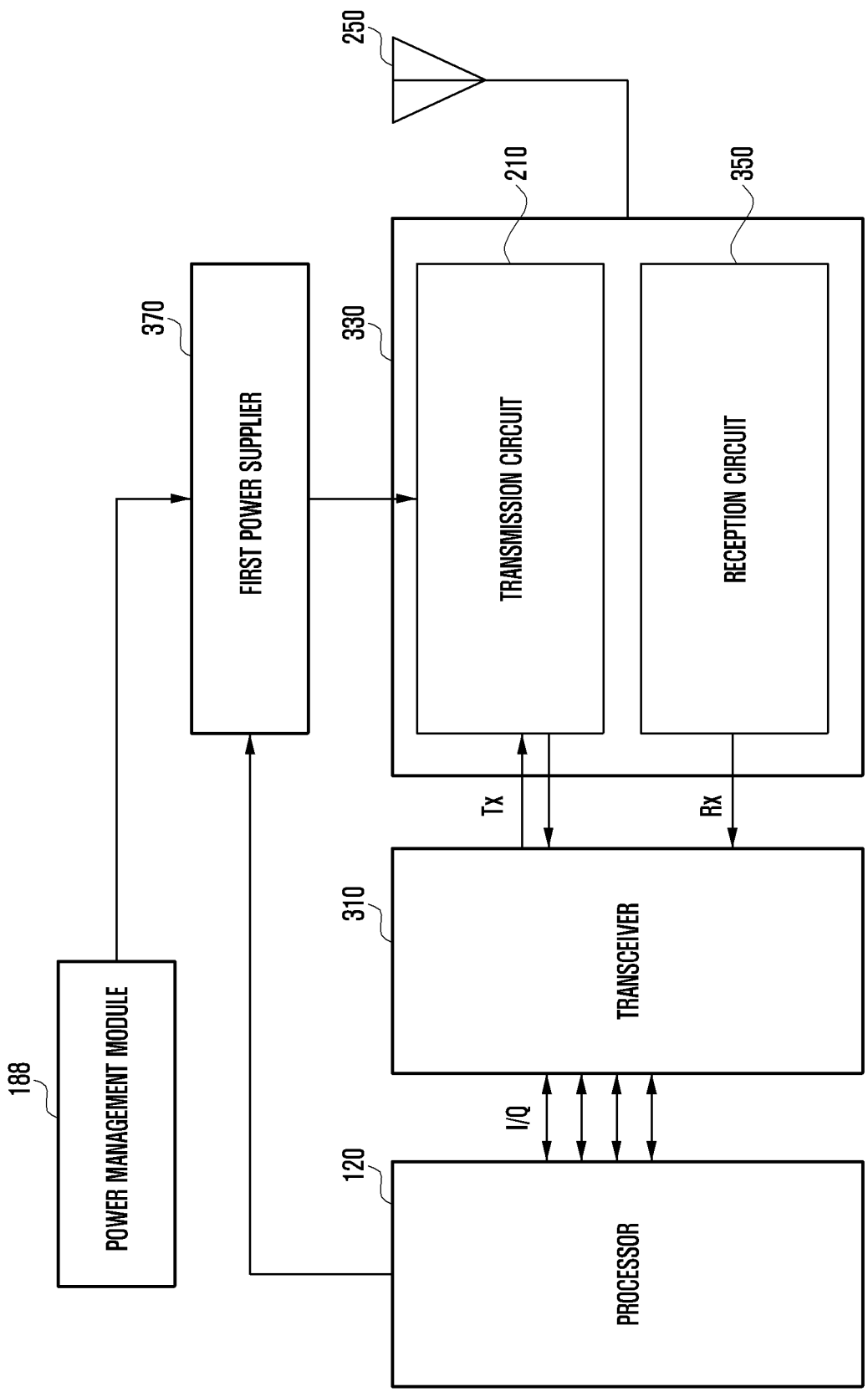
FIG. 3 illustrates a configuration related to communication of an electronic device according to various embodiments.

FIG. 3 illustrates a configuration related to communication of an electronic device according to various embodiments. FIG. 3 may illustrate the configuration of the electronic device in FIG. 2A in detail.

Referring to FIG. 3, an electronic device (e.g., the electronic device 101 of FIG. 1) according to various embodiments may include at least one of a power management module (e.g., the power management module 188 of FIG. 1), a first power supplier 370, a processor 120 (e.g., the processor 120 of FIG. 1), a transceiver 310, a communication circuit 330, or a first antenna 250 (e.g., the antenna module 197 of FIG. 1). The communication circuit 330 may include a transmission circuit 210 (e.g., the transmission circuit 210 of FIGS. 2A and 2B) or a reception circuit 350. FIG. 3 illustrates that an ET signal (e.g., a TX envelop waveform) is provided from the processor 120 to the first power supplier 370, but the ET signal may be provided from the transceiver 310 to the first power supplier 370. The ET signal may be provided to one of the processor 120 or the transceiver 310. FIG. 3 is merely provided to help understanding of the disclosure, but does not limit the disclosure.

The power management module 188 may manage power supplied to the electronic device 101. The power management module 188 may supply power to the first power supplier 370. In an embodiment, the first power supplier 370 may receive power supplied from the power management module 188, and receive an envelope from the processor 120 or the transceiver 310. The first power supplier 370 may provide power corresponding to the envelope to the communication circuit 330 by using the supplied power. The first power supplier 370 may be a component for providing a voltage applied to an amplifier (e.g., the first amplifier 211 of FIGS. 2A and 2B). The power corresponding to the envelope may be provided to the first amplifier (e.g., the first amplifier 211 of FIGS. 2A and 2B) included in the transmission circuit 210 of the communication circuit 330.

According to an embodiment, the processor 120 may generate a baseband signal and transfer the same to the transceiver 310, and the baseband signal may be converted into a radio frequency signal (hereinafter, referred to as an "RF signal") through the transceiver 310 and input to the first amplifier 211. During the ET operation, the processor 120 may transfer envelope information to the first power supplier 370, based on an envelope of the signal input from the transceiver 310 to the first amplifier 211, and the first power supplier 370 may supply power (or a voltage) to the first amplifier 211.

The processor 120 may determine whether to use the first amplifier 211 or use the first amplifier 211 and the second amplifier 217, based on the magnitude (or the magnitude of power) of the RF signal (e.g., the amplified RF signal) output through the first antenna 250. The processor 120 may determine to use the first amplifier 211 (and not the second amplifier 217) when the power (or the magnitude of the power) of the output RF signal is equal to or less than a reference value, and determine to use the first amplifier 211 and the second amplifier 217 when the power (or the magnitude of the power) of the output RF signal is greater than the reference value. The processor 120 may control a first switch (e.g., the first switch 215 of FIGS. 2A and 2B) and a second switch (e.g., the second switch 221 of FIGS. 2A and 2B), based on the determined amplifier (or the number of amplifiers). FIG. 3 illustrates the processor 120, but the processor 120 may indicate a communication processor included in a communication module (e.g., the communication module 190 of FIG. 1).

The transceiver 310 may correspond to an RFIC, and during transmission, may convert a baseband signal generated by the processor 120 into a radio frequency (RF) signal (e.g., a Tx signal) corresponding to a designated frequency band. The converted radio frequency signal corresponds to a signal to be transmitted through the first antenna 250, and may be input as an input signal of the transmission circuit 210. During transmission, the transceiver 310 may transfer the converted radio frequency signal (e.g., a Tx signal) to the transmission circuit 210. During reception, the transceiver 310 may acquire a radio frequency signal (e.g., an Rx signal) received from the first antenna 250, through the reception circuit 350, and convert the acquired radio frequency signal into a baseband signal. During the reception, the transceiver 310 may transfer the converted baseband signal to the processor 120.

The processor 120 may process a baseband signal, and thus the transceiver 310 may convert a baseband signal acquired from the processor 120 into a radio frequency signal (e.g., a Tx signal) to be transmitted, or may convert a received radio frequency signal (e.g., an Rx signal) to a baseband signal to be processed by the processor 120. To help understanding of the disclosure, the baseband signal and the radio frequency signal are described to be distinguished from each other, but the description does not limit the disclosure.

The communication circuit 330 may amplify a radio frequency signal to be transmitted through the first antenna 250, or may amplify a radio frequency signal received from the first antenna 250. The communication circuit 330 may include a power amplifier (PA) (e.g., the first amplifier 211 and the second amplifier 217 of FIGS. 2A and 2B), a low noise amplifier (LNA), a filter, a duplexer, a mobile industry processor interface (MIPI) controller, or an antenna switch (ASW). The power amplifier may amplify a radio frequency signal (e.g., a Tx signal) to be transmitted through the first antenna 250. The low noise amplifier may amplify a radio frequency signal (e.g., an Rx signal) received from the first antenna 250. The filter and the duplexer may be connected to the first antenna 250 and may divide a transmission/reception frequency of the electronic device 101. The filter and the duplexer may include multiple filters or duplexers for each frequency band.

The MIPI controller, formed as a switch module, may control the filter and the duplexer to be connected to the power amplifier when a radio frequency signal (e.g., a Tx signal) is transmitted, and control the filter and the duplexer to be connected to the low noise amplifier when a radio frequency signal (e.g., an Rx signal) is received. The antenna switch may determine an antenna to be transmitted. The communication circuit 330 may include more elements (e.g., electronic components, passive elements, etc.) than the elements described above.

The power amplifier may be included in the transmission circuit 210, and the low noise amplifier may be included in the reception circuit 350. The transmission circuit 210 or the reception circuit 350 may include more elements (e.g., electronic components, passive elements, etc.) than the elements above, but only some elements related to the disclosure are described here. To help understanding of the disclosure, the transmission circuit 210 and the reception circuit 350 are described to be distinguished from each other, but the transmission circuit 210 and the reception circuit 350 may be formed (or implemented) as one circuit or chip (e.g., a single chip) integrated into the communication circuit 330.

According to an embodiment, the transmission circuit 210 may include at least one of the first amplifier 211, the first coupler 213, the first switch 215, the second amplifier 217, the second coupler 219, the second switch 221, or the phase shifter 223 included in FIG. 2A or 2B. The transmission circuit 210 may, upon the control by the processor 120, transfer an RF signal amplified by the first amplifier 211 (and not by the second amplifier 217) to the first antenna 250, or transfer an RF signal amplified by the first amplifier 211 and the second amplifier 217 to the first antenna 250. A detailed description of the transmission circuit 210 will be made through FIGS. 4A to 4C below.

FIGS. 4A to 4C are circuit diagrams related to communication of an electronic device according to various embodiments. FIGS. 4A to 4C may be circuit diagrams related to communication of the electronic device of FIGS. 2A and 3.

FIG. 4A illustrates a first circuit diagram 400 related to communication of an electronic device according to various embodiments.

Referring to FIG. 4A, an electronic device (e.g., the electronic device 101 of FIG. 1) according to various embodiments may include at least one of a power management module (e.g., the power management module 188 of FIG. 1), a first power supplier (e.g., the first power supplier 370 of FIG. 3), a processor (e.g., the processor 120 of FIG. 1), a transceiver (e.g., the transceiver 310 of FIG. 3), a communication circuit (e.g., the communication circuit 330 of FIG. 3), or a first antenna 250 (e.g., the antenna module 197 of FIG. 1). The communication circuit 330 may include a transmission circuit (e.g., the transmission circuit 210 of FIGS. 2A and 2B). Although not shown, the communication circuit 330 may further include a reception circuit (e.g., the reception circuit 350 of FIG. 3). Hereinafter, only the transmission circuit 210 related to the disclosure is described, but the disclosure is not limited by the description.

FIG. 4A illustrates that an ET signal (e.g., a Tx envelop waveform) is provided from the processor 120 to the first power supplier 370, but the ET signal may be provided from the transceiver 310 to the first power supplier 370. The ET signal may be provided by one of the processor 120 or the transceiver 310. FIG. 4A is merely provided to help understanding of the disclosure, but does not limit the disclosure.

According to an embodiment, the transmission circuit 210 may include at least one of a first amplifier (e.g., the first amplifier 211 of FIGS. 2A and 2B), a first coupler (e.g., the first coupler 213 of FIGS. 2A and 2B), a first switch (e.g., the first switch 215 of FIGS. 2A and 2B), a second amplifier (e.g., the second amplifier 217 of FIGS. 2A and 2B), a second coupler (e.g., the second coupler 219 of FIGS. 2A and 2B), a second switch (e.g., the second switch 221 of FIGS. 2A and 2B), a phase shifter (e.g., the phase shifter 223 of FIGS. 2A and 2B), a first filter 411, a second filter 413, or a third filter 415.

The power management module 188 may manage power supplied to the electronic device 101. The power management module 188 may supply power (VPH_PWR) to the first power supplier 370. In an embodiment, the first power supplier 370 may receive power supplied from the power management module 188, and receive an envelope (a Tx envelop waveform) from the processor 120. The first power supplier 370 may provide power (Vcc) corresponding to the envelope to the communication circuit 330 by using the supplied power. The first power supplier 370 may be a component for providing a voltage applied to the first amplifier 211. The power corresponding to the envelope may be provided to the first amplifier 211 included in the transmission circuit 210 of the communication circuit 330.

According to an embodiment, the processor 120 may generate an RF signal to be input to the first amplifier 211. The generated RF signal may be transferred to the transceiver 310. The processor 120 may determine the magnitude of the RF signal, based on a signal control table stored in a memory (e.g., the memory 130 of FIG. 1). The signal control table may include transmission output power (or a code value) corresponding to the magnitude of power of the RF signal.

During the ET operation, the processor 120 may transfer envelope information to the first power supplier 370, based on an envelope of the signal input from the transceiver 310 to the first amplifier 211, and the first power supplier 370 may supply power (or a voltage) to the first amplifier 211.

According to an embodiment, the processor 120 may determine whether to use the first amplifier 211 or use the first amplifier 211 and the second amplifier 217, based on the magnitude (or the magnitude of power) of the RF signal (e.g., the amplified RF signal) output through the first antenna 250. For example, the processor 120 may determine to use the first amplifier 211 when the power (or the magnitude of the power) of the output RF signal is equal to or less than a reference value, and determine to use the first amplifier 211 and the second amplifier 217 when the power (or the magnitude of the power) of the output RF signal is greater than the reference value. The processor 120 may control the first switch 215 and the second switch 217, based on the determined amplifier (or the number of amplifiers). FIG. 4A illustrates the processor 120, but the processor 120 may indicate a communication processor included in a communication module (e.g., the communication module 190 of FIG. 1).

According to an embodiment, the processor 120 may determine a first transmission path when the first amplifier 211 is used (e.g., when the power of the output signal is equal to or less than the reference value), and control the first switch 215 and the second switch 221, based on the first transmission path. For example, in the first transmission path, the first switch 215 may be switched so that the signal output from the second port of the first coupler 213 is input to the second switch 221. In the first transmission path, the second switch 221 may be switched so that the signal transferred from the first switch 215 is output. The signal output from the second switch 221 may be input to the transceiver 310 through a second line (or port) 403.

According to an embodiment, when the first amplifier 211 and the second amplifier 217 are used (e.g., when the power of the amplified (or output) RF signal is greater than the reference value), the processor 120 may control the signal output from the second port of the first coupler 213 to be input to the second amplifier 217. When the first amplifier 211 and the second amplifier 217 are used, the processor 120 may determine a second transmission path, and control the first switch 215 and the second switch 221, based on the second transmission path. For example, in the second transmission path, the first switch 215 may be switched so that the signal output from the second port of the first coupler 213 is input to the second amplifier 217.

The transceiver 310 may correspond to an RFIC, and during transmission, may convert a baseband signal generated by the processor 120 into a radio frequency (RF) signal (e.g., a Tx signal) corresponding to a designated frequency band. The converted radio frequency signal corresponds to a signal to be transmitted through the first antenna 250, and may be input as an input signal of the transmission circuit 210 through a first line (or port) 401. The transceiver 310 may control the magnitude of the power of the RF signal output through the first antenna 250, based on a signal (e.g., an RF signal output through the first antenna 250) output from the second switch 221. Alternatively, the transceiver 310 may transfer the signal output from the second switch 221 to the processor 120, and receive a control signal for controlling the magnitude of the power of the RF signal in the transceiver 310 from the processor 120, and the transceiver 310 may provide, as an input signal of the transmission circuit 210, an RF signal according to the control signal.

During the transmission, the transceiver 310 may transfer the converted radio frequency signal (e.g., a Tx signal) to the transmission circuit 210. During reception, the transceiver 310 may acquire a radio frequency signal (e.g., an Rx signal) received from the first antenna 250, through the reception circuit 350, and convert the acquired radio frequency signal into a baseband signal. During the reception, the transceiver 310 may transfer the converted baseband signal to the processor 120.

The communication circuit 330 may amplify a radio frequency signal to be transmitted through the first antenna 250, or may amplify a radio frequency signal received from the first antenna 250. The transmission circuit 210 included in the communication circuit 330 may amplify a radio frequency signal to be transmitted through the first antenna 250.

The first amplifier 211 may acquire, as an input signal, a radio frequency signal to be transmitted through the antenna 250, from the transceiver 310, and amplify the acquired RF signal. According to various embodiments, at least one of an ET technology, an APT technology, and an SPT technology may be applied to the first amplifier 211. The first amplifier 211 may receive power supplied from the first power supplier 370, and use the same to amplify the RF signal.

The amplified RF signal may be input to the first coupler 213. According to various embodiments, the amplified RF signal may be input to the first coupler 213 through the first filter 411. The first filter 411 may be disposed between the first amplifier 211 and the first coupler 213, and filter the RF signal amplified by the first amplifier 211. The first coupler 213 may distribute the amplified RF signal. The first coupler 213 may output most of the amplified RF signal to a first port, and output at least a part of the amplified RF signal to a second port. The signal output from the first port of the first coupler 213 may be input to the first antenna 250, and the signal output from the second port of the first coupler 213 may be input to the first switch 215 to be used for power measurement of the transceiver 310. The signal input to the first antenna 250 may be output (or propagated) to the outside.

According to an embodiment, the first switch 215 may be disposed in a line output from the second port of the first coupler 213, and the second switch 221 may be disposed in an input line (e.g., the second line 403) of the transceiver 310. The first switch 215 may include one input port and two output ports. For example, the input port of the first switch 215 may be connected to a second port of the first coupler 213. A first output port of the first switch 215 may be connected to the input port of the second amplifier 217, and a second output port of the first switch 215 may be connected to an input port of the second switch 221. The second switch 221 may include two input ports and one output port. For example, a first input port of the second switch 221 may be connected to a second output port of the first switch 215, and a second input port of the second switch 221 may be connected to a second port of the second coupler 219. An output port of the second switch 221 may be connected to the input port (e.g., the second line 403) of the transceiver 310.

According to an embodiment, when the first amplifier 211 is used, the output signal of the first switch 215 may be input as an input signal of the second switch 221, and the output signal of the second switch 221 may be transferred (or input) to the transceiver 310. In another example, when the first amplifier 211 and the second amplifier 217 are used, the output signal of the first switch 215 may be utilized as an input signal of the second amplifier 217. According to various embodiments, the output signal of the first switch 215 may be input to the second amplifier 217 through the second filter 413. The second filter 413 may be disposed between the first switch 215 and the second amplifier 217, and filter a signal (e.g., a signal output to the second port of the first coupler 213) output from the first switch 215. According to the implementation of the electronic device 101 in various embodiments, the second filter 413 may be omitted.

The second amplifier 217 may acquire the output signal of the first switch 215 (e.g., the signal output to the second port of the first coupler 213), and amplify the acquired signal. Hereinafter, the RF signal amplified through the first amplifier 211 may be a first amplifier output signal, and the RF signal amplified through the second amplifier 217 may be a second amplifier output signal.

The second amplifier output signal may be input to the second coupler 219. According to various embodiments, the second amplifier output signal may be input to the second coupler 219 through the third filter 415. The third filter 415 may be disposed between the second amplifier 217 and the second coupler 219, and filter the RF signal amplified by the second amplifier 217 (e.g., the second amplifier output signal). The second coupler 219 may output most of the second amplifier output signal to the first port, and output at least a part of the second amplifier output signal to the second port. The signal output from the first port of the second coupler 219 may be input to the phase shifter 223, and the signal output from the second port of the second coupler 219 may be input to the second switch 221 to be used for power measurement of the transceiver 310. In the second transmission path, the second switch 221 may be switched so that the signal output from the second port of the second coupler 219 is output. The signal output from the second switch 221 may be input to the transceiver 310.

According to an embodiment, the phase of the second amplifier output signal, input to the phase shifter 223, may be shifted. The first amplifier output signal may correspond to an RF signal amplified through the first amplifier 211, and the second amplifier output signal may correspond to an RF signal amplified through the second amplifier 217, and thus at least a part of (or entire) signal may be attenuated when the first amplifier output signal and the second amplifier output signal are combined. The second amplifier 217 is used together with the first amplifier 211 to increase transmission output power. When the first amplifier output signal is attenuated by the second amplifier output signal, the transmission output power may not be increased. The phase shifter 223 may shift the phase of the second amplifier output signal to prevent the first amplifier output signal from being attenuated by the second amplifier output signal. The second amplifier output signal output from the phase shifter 223 may be combined with the first amplifier output signal and input to the first antenna 250. The signal input to the first antenna 250 (e.g., first amplifier output signal+second amplifier output signal) may be output (or propagated) to the outside.

FIG. 4B illustrates a first transmission path when a first amplifier is used in a first circuit diagram related to communication of an electronic device according to various embodiments. FIG. 4B illustrates a $(1-1)^{th}$ circuit diagram 430 illustrating a first transmission path (e.g., a first signal output path 440 or a first signal transmission path 445) in the first circuit diagram 400 of FIG. 4A.

Referring to FIG. 4B, in the $(1-1)^{th}$ circuit diagram 430, the electronic device 101 may include at least one of a power management module 188, a first power supplier 370, a processor 120, a transceiver 310, a communication circuit 330, or a first antenna 250. The communication circuit 330 may include a transmission circuit 210. The transmission circuit 210 may include at least one of a first amplifier 211, a first coupler 213, a second switch 215, a second amplifier 217, a second coupler 219, a second switch 221, or a phase shifter 223. The description of elements identical or similar to those in FIG. 4A will be simply made.

The power management module 188 may manage power supplied to the electronic device 101. The power management module 188 may supply power (VPH_PWR) to the first power supplier 370. In an embodiment, the first power supplier 370 may receive power supplied from the power management module 188, and receive an envelope (a Tx envelop waveform) from the processor 120. The first power supplier 370 may provide power (Vcc) corresponding to the envelope to the communication circuit 330 by using the supplied power. The first power supplier 370 may be a component for providing a voltage applied to the first amplifier 211. The power corresponding to the envelope may be provided to the first amplifier 211 included in the transmission circuit 210 of the communication circuit 330.

The processor 120 may generate a baseband signal to be input to the first amplifier 211. The generated baseband signal may be transferred to the transceiver 310, converted into an RF signal through the transceiver 310, and input as an input signal of the first amplifier 211. During the ET operation, the processor 120 may transfer envelope information to the first power supplier 370, based on an envelope of the RF signal input from the transceiver 310 to the first amplifier 211, and the first power supplier 370 may supply power (or a voltage) to the first amplifier 211.

According to an embodiment, the processor 120 may determine a first transmission path when the first amplifier 211 is used, and control the first switch 215 and the second switch 221, based on the first transmission path. For example, the first transmission path may include the first signal output path 440 or the first signal transmission path 445. In the first signal output path 440, the first amplifier output signal output from the first amplifier 211 may be output to the outside through the first antenna 250. In the first signal transmission path 445, at least a part of the first amplifier output signal output from the first amplifier 211 may be transferred to the transceiver 310 to be used for power measurement of the transceiver 310.

The first amplifier 211 may acquire, as an input signal, a radio frequency signal to be transmitted through the antenna 250, from the transceiver 310, and amplify the acquired RF signal. The amplified RF signal may be input to the first coupler 213. The first coupler 213 may output most of the amplified RF signal to a first port, and output at least a part of the amplified RF signal to a second port. The signal output from the first port of the first coupler 213 may be input to the first antenna 250, and the signal output from the second port of the first coupler 213 may be input to the first switch 215.

In the first transmission path, the output signal of the first switch 215 may be controlled to be used as an input signal of the second switch 221. In the first signal output path 440, the first amplifier output signal output from the first amplifier 211 may be transferred to the first antenna 250 through the first filter 411 and the first coupler 213 (e.g., the first port of the first coupler 213). In the first signal transmission path 445, the first amplifier output signal output from the first amplifier 211 may be input to the second switch 221 through the first filter 411 and the first coupler 213 (e.g., the second port of the first coupler 213). In the first transmission path, the second switch 221 may be switched so that the signal transferred from the first switch 215 is output. The signal output from the second switch 221 may be input to the transceiver 310 through a second line (or port) 403.

FIG. 4C illustrates a second transmission path when a first amplifier and a second amplifier are used in a first circuit diagram related to communication of an electronic device according to various embodiments. FIG. 4C illustrates a $(1-2)^{th}$ circuit diagram 450 illustrating a second transmission path (e.g., a second signal output path 460 or a second signal transmission path 465) in the first circuit diagram 400 in FIG. 4A.

Referring to FIG. 4C, in the $(1-2)^{th}$ circuit diagram 450, the electronic device 101 may include at least one of a power management module 188, a first power supplier 370, a processor 120, a transceiver 310, a communication circuit 330, or a first antenna 250. The communication circuit 330 may include a transmission circuit 210. The transmission circuit 210 may include at least one of a first amplifier 211, a first coupler 213, a second switch 215, a second amplifier 217, a second coupler 219, a second switch 221, or a phase shifter 223. The description of elements identical or similar to those in FIG. 4A will be simply made.

The power management module 188 may manage power supplied to the electronic device 101. The power management module 188 may supply power (VPH_PWR) to the first power supplier 370. In an embodiment, the first power supplier 370 may receive power supplied from the power management module 188, and receive an envelope (a Tx envelop waveform) from the processor 120. The first power supplier 370 may provide power (Vcc) corresponding to the envelope to the communication circuit 330 by using the supplied power. The first power supplier 370 may be a component for providing a voltage applied to the first amplifier 211. The power corresponding to the envelope may be provided to the first amplifier 211 included in the transmission circuit 210 of the communication circuit 330.

The processor 120 may generate an RF signal to be input to the first amplifier 211. The generated RF signal may be transferred to the transceiver 310. During the ET operation, the processor 120 may transfer envelope information to the first power supplier 370, based on an envelope of the signal input from the transceiver 310 to the first amplifier 211, and the first power supplier 370 may supply power (or a voltage) to the first amplifier 211.

The processor 120 may determine a second transmission path when the first amplifier 211 and the second amplifier 217 are used, and control the first switch 215 and the second switch 221, based on the second transmission path. For example, the second transmission path may include the second signal output path 460 or the second signal transmission path 465. In the second signal output path 460, the first amplifier output signal output from the first amplifier 211 and the RF signal amplified by the second amplifier 217 (e.g., the second amplifier output signal) may be combined with each other (e.g., first amplifier output signal+second amplifier output signal) and output to the outside through the first antenna 250. In the second signal transmission path 465, at least a part of the second amplifier output signal output from the second amplifier 217 may be transferred to the transceiver 310 to be used for power measurement of the transceiver 310.

According to an embodiment, in the second signal output path 460, the first amplifier output signal output from the first amplifier 211 may go through the first filter 411 and the first coupler 213 (e.g., the first port of the first coupler 213) and may be combined with the second amplifier output signal output from the second amplifier 217, so as to be transferred to the first antenna 250. In the second transmission path, the output signal of the first switch 215 may be controlled to be used as an input signal of the second amplifier 217. According to various embodiments, the output signal of the first switch 215 may be input to the second amplifier 217 through the second filter 413. The second filter 413 may be disposed between the first switch 215 and the second amplifier 217, and filter the signal output from the first switch 215 (e.g., the signal output to the second port of the first coupler 213). According to various embodiments, according the implementation of the electronic device 101, the second filter 413 may be omitted.

The second amplifier 217 may acquire an output signal of the first switch 215 (e.g., the signal output to the second port of the first coupler 213), and amplify the acquired signal. The RF signal amplified by the second amplifier 217 (e.g., the second amplifier output signal) may be input to the second coupler 219. According to various embodiments, the second amplifier output signal may be input to the second coupler 219 through the third filter 415. The third filter 415 may be disposed between the second amplifier 217 and the second coupler 219, and filter the second amplifier output signal. The second coupler 219 may output most of the second amplifier output signal to the first port, and output at least a part of the second amplifier output signal to the second port. The signal output to the first port may be input to the phase shifter 223, and the signal output to the second port may be input to the second switch 221. The phase of the second amplifier output signal input to the phase shifter 223 may be shifted, and the phase-shifted second amplifier output signal may be combined with the first amplifier output signal and transferred to the first antenna 250. The signal input to the first antenna 250 (e.g., first amplifier output signal+second amplifier output signal) may be output (or propagated) to the outside.

According to an embodiment, in the second signal transmission path 465, at least a part of the first amplifier output signal may be output to the second port of the first coupler 213, and input from the second port of the first coupler 213 to the second amplifier 217 through the first switch 215, the second amplifier output signal output by the second amplifier 217 may be input to the second coupler 219, the at least a part of the second amplifier output signal may be output to the second port of the second coupler 219, input as an input signal of the second switch 221, and output to the output port of the second switch 221. The signal output from the second switch 221 may be input to the transceiver 310 through a second line (or port) 403.

FIG. 5 illustrates a configuration related to communication of an electronic device according to various embodiments. FIG. 5 may illustrate the configuration of the electronic device of FIG. 2B in detail.

Referring to FIG. 5, an electronic device (e.g., the electronic device 101 of FIG. 1) according to various embodiments may include at least one of a power management module (e.g., the power management module 188 of FIG. 1), a first power supplier 370, a second power supplier 375, a processor (e.g., the processor 120 of FIG. 1), a transceiver 310, a communication circuit 330, a first antenna 250 (e.g., the antenna module 197 of FIG. 1), or a second antenna 255 (e.g., the antenna module 197 of FIG. 1). The communication circuit 330 may include a transmission circuit 210 (e.g., the transmission circuit 210 of FIGS. 2A and 2B) or a reception circuit 350.

FIG. 5 illustrates that an ET signal (e.g., a Tx envelop waveform) is provided from the processor 120 to the first power supplier 370 or the second power supplier 375, but the ET signal may be provided from the transceiver 310 to the first power supplier 370 or the second power supplier 375. The ET signal may be provided to one of the processor 120 or the transceiver 310. FIG. 5 is merely provided to help understanding of the disclosure, but does not limit the disclosure.

As compared to the configuration in FIG. 3, in FIG. 5, the electronic device 101 may further include the second power supplier 375 and the second antenna 255. A description of elements identical or similar to those of FIG. 3 will be simply made.

The power management module 188 may manage power supplied to the electronic device 101. The power management module 188 may supply power to the first power supplier 370 or the second power supplier 375.

According to an embodiment, the first power supplier 370 may receive power supplied from the power management module 188, and receive an envelope from the processor 120. The first power supplier 370 may provide power corresponding to the envelope to the communication circuit 330 by using the supplied power. The first power supplier 370 may be a component for providing a voltage applied to the first amplifier 211. The power corresponding to the envelope may be provided to a first amplifier (e.g., the first amplifier 211 of FIGS. 2A and 2B) included in the transmission circuit 210 of the communication circuit 330.

According to an embodiment, the second power supplier 375 may receive power supplied from the power management module 188, and receive an envelope from the processor 120. The second power supplier 375 may provide power corresponding to the envelope to the communication circuit 330 by using the supplied power. The second power supplier 375 may be a component for providing a voltage applied to a second amplifier (e.g., the second amplifier 217 of FIGS. 2A and 2B). The power corresponding to the envelope may be provided to the second amplifier 217 included in the transmission circuit 210 of the communication circuit 330.

The processor 120 may generate an RF signal input to the first amplifier 211. The generated RF signal may be transferred to the transceiver 310. The processor 120 may determine the magnitude of the RF signal, based on a signal control table stored in a memory (e.g., the memory 130 of FIG. 1).

According to an embodiment, the processor 120 may determine whether to use the first amplifier 211 or use the first amplifier 211 and the second amplifier 217, based on the magnitude (or the magnitude of power) of the RF signal (e.g., the amplified RF signal) output through the first antenna 250 or the second antenna 255. For example, the processor 120 may determine to use the first amplifier 211 when the power (or the magnitude of the power) of the output RF signal is equal to or less than a reference value, and determine to use the first amplifier 211 and the second amplifier 217 when the power (or the magnitude of the power) of the output RF signal is greater than the reference value.

According to an embodiment, during the ET operation, the processor 120 may transfer envelope information to at least one of the first power supplier 370 and the second power supplier 375, based on an envelope of the signal input from the transceiver 310 to the first amplifier 211. The processor 120 may transfer the envelope to at least one of the first power supplier 370 and the second power supplier 375, based on the determined amplifier (or the number of amplifiers). For example, the processor 120 may transfer the envelop to the first power supplier 370 when the first amplifier 211 is used. The processor 120 may transfer the envelope to the first power supplier 370 and the second power supplier 375 when the first amplifier 211 and the second amplifier 217 are used.

According to an embodiment, the processor 120 may control a first switch (e.g., the first switch 215 of FIGS. 2A and 2B) and a second switch (e.g., the second switch 221 of FIGS. 2A and 2B), based on the determined amplifier (e.g., the number of amplifiers). FIG. 5 illustrates the processor 120, but the processor 120 may indicate a communication processor included in a communication module (e.g., the communication module 190 of FIG. 1).

The transceiver 310 may correspond to an RFIC, and during transmission, may convert a baseband signal generated by the processor 120 into a radio frequency (RF) signal (e.g., a Tx signal) corresponding to a designated frequency band. The converted radio frequency signal corresponds to a signal to be transmitted through the first antenna 250 or the second antenna 255, and may be input as an input signal of the transmission circuit 210. During the transmission, the transceiver 310 may transfer the converted radio frequency signal (e.g., the Tx signal) to the transmission circuit 210. During reception, the transceiver 310 may acquire a radio frequency signal (e.g., an Rx signal) received from the first antenna 250 or the second antenna 255, through the reception circuit 350, and convert the acquired radio frequency signal into a baseband signal. During the reception, the transceiver 310 may transfer the converted baseband signal to the processor 120.

According to an embodiment, the communication circuit 330 may amplify a radio frequency signal to be transmitted through the first antenna 250 or the second antenna 255, or may amplify a radio frequency signal received from the first antenna 250 or the second antenna 255. The communication circuit 330 may include a power amplifier (e.g., the first amplifier 211 and the second amplifier 217 of FIGS. 2A and 2B), a low noise amplifier (LNA), a filter, a duplexer, a MIPI controller, or an antenna switch. The power amplifier may amplify a radio frequency signal (e.g., a Tx signal) to be transmitted through the first antenna 250 or the second antenna 255. The low noise amplifier may amplify a radio frequency signal (e.g., an Rx signal) received from the first antenna 250 or the second antenna 255.

The power amplifier may be included in the transmission circuit 210, and the low noise amplifier may be included in the reception circuit 350. The transmission circuit 210 or the reception circuit 350 may include more elements (e.g., electronic components, passive elements, etc.) than the elements above, but only some elements related to the disclosure are described here. To help understanding of the disclosure, the transmission circuit 210 and the reception circuit 350 are described to be distinguished from each other, but the transmission circuit 210 and the reception circuit 350 may be formed (or implemented) as one circuit or chip (e.g., a single chip) integrated into the communication circuit 330.

The transmission circuit 210 may include at least one of the first amplifier 211, the first coupler 213, the first switch 215, the second amplifier 217, the second coupler 219, or the second switch 221 included in FIG. 2A or 2B. The transmission circuit 210 may, upon the control by the processor 120, transfer the first amplifier output signal output from the first amplifier 211 to the first antenna 250, or transfer the second amplifier output signal output from the second amplifier 217 to the second antenna 255. A detailed description of the transmission circuit 210 will be made through FIGS. 6A to 6C below.

Figure 6A:
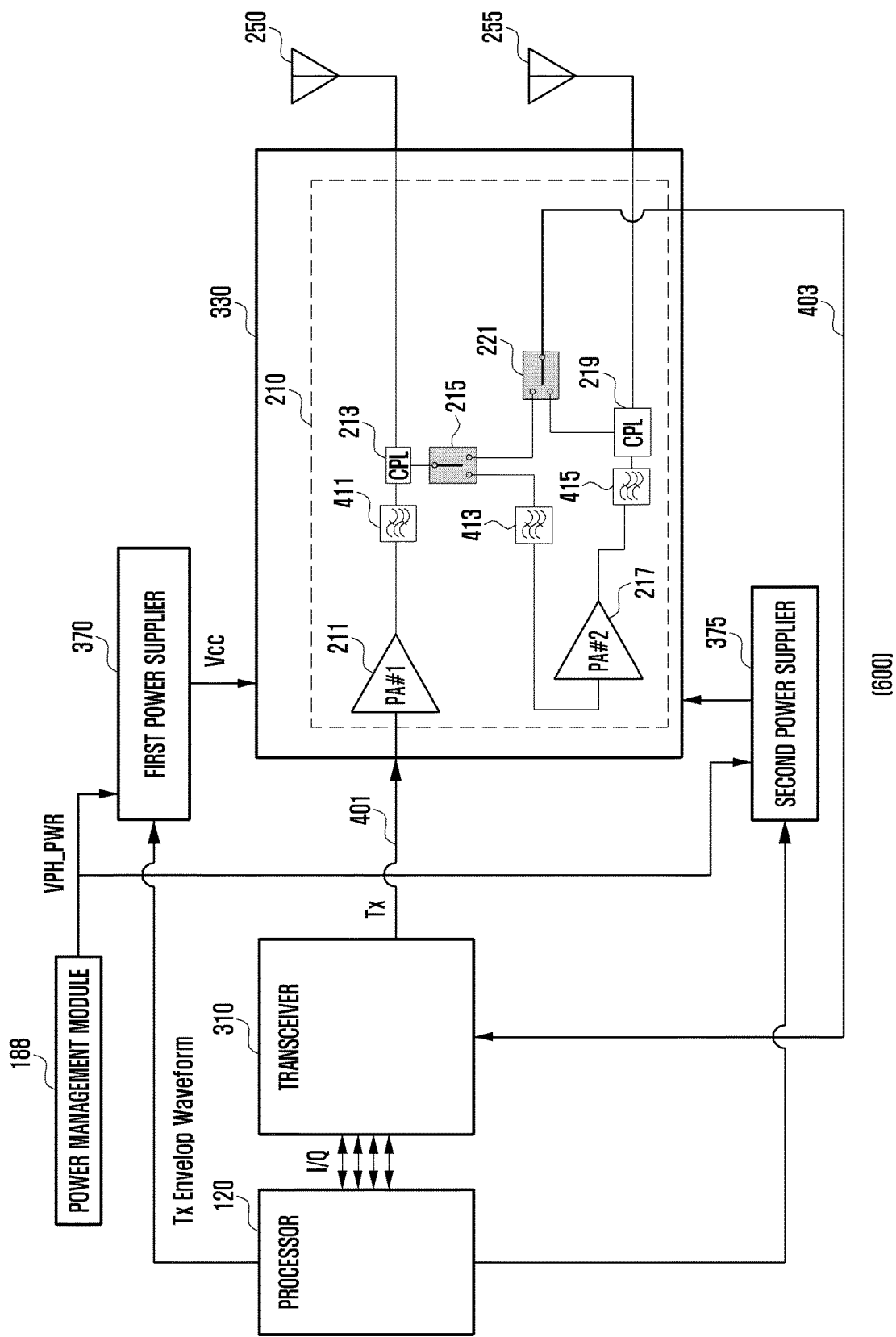
FIGS. 6A to 6C are circuit diagrams related to communication of an electronic device according to various embodiments.
Figure 6B:
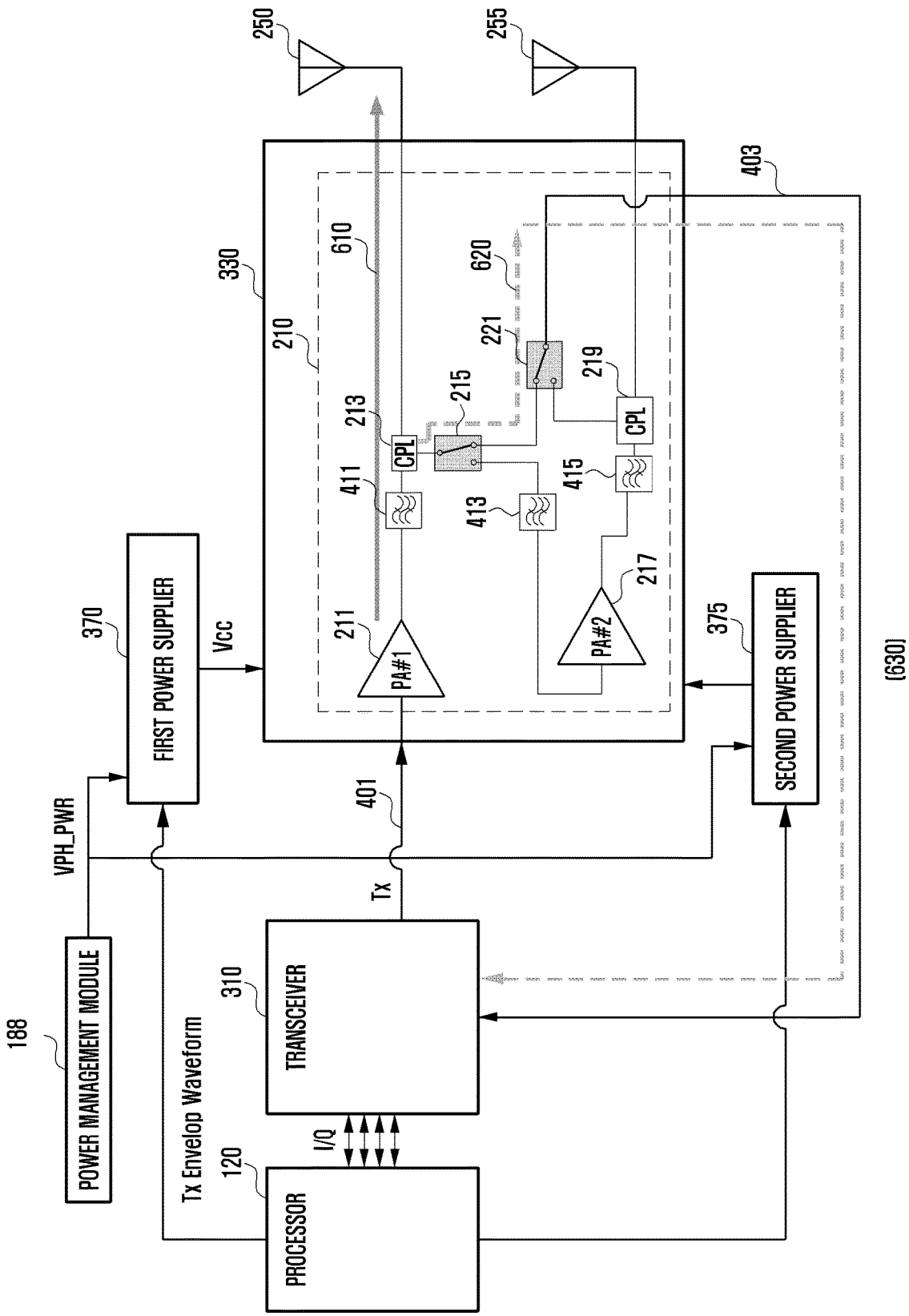
Figure 6C:
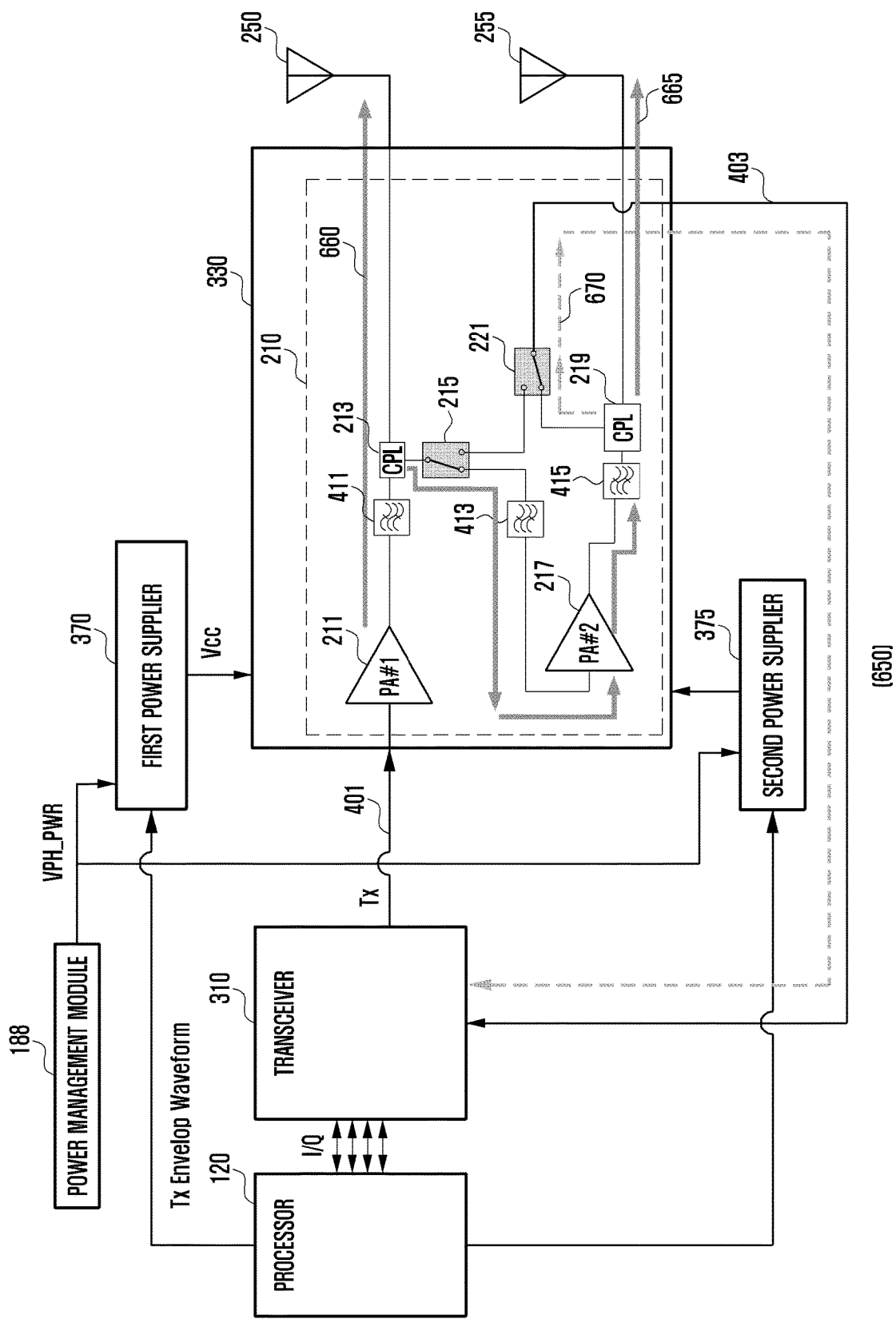

FIGS. 6A to 6C are circuit diagrams related to communication of an electronic device according to various embodiments. FIGS. 6A to 6C may be circuit diagrams related to communication of the electronic device of FIGS. 2B and 5.

FIG. 6A illustrates a second circuit diagram 600 related to communication of an electronic device according to various embodiments.

Referring to FIG. 6A, an electronic device (e.g., the electronic device 101 of FIG. 1) according to various embodiments may include at least one of a power management module (e.g., the power management module 188 of FIG. 1), a first power supplier (e.g., the first power supplier 370 of FIG. 3), a second power supplier (e.g., the second power supplier 375 of FIG. 5), a processor (e.g., the processor 120 of FIG. 1), a transceiver (e.g., the transceiver 310 of FIG. 3), a communication circuit (e.g., the communication circuit 330 of FIG. 3), a first antenna 250 (e.g., the antenna module 197 of FIG. 1), or a second antenna module 255 (e.g., the antenna module 197 of FIG. 1). The communication circuit 330 may include a transmission circuit (e.g., the transmission circuit 210 of FIGS. 2A and 2B). Although not shown, the communication circuit 330 may further include a reception circuit (e.g., the reception circuit 350 of FIG. 3 or 5). Hereinafter, only the transmission circuit 210 related to the disclosure is described, but the disclosure is not limited by the description.

FIG. 6A illustrates that an ET signal (e.g., a TX envelop waveform) is provided from the processor 120 to the first power supplier 370 or the second power supplier 375, but the ET signal may be provided from the transceiver 310 to the first power supplier 370 or the second power supplier 375. The ET signal may be provided to one of the processor 120 or the transceiver 310. FIG. 5 is merely provided to help understanding of the disclosure, but does not limit the disclosure.

According to an embodiment, the transmission circuit 210 may include at least one of a first amplifier (e.g., the first amplifier 211 of FIGS. 2A and 2B), a first coupler (e.g., the first coupler 213 of FIGS. 2A and 2B), a first switch (e.g., the first switch 215 of FIGS. 2A and 2B), a second amplifier (e.g., the second amplifier 217 of FIGS. 2A and 2B), a second coupler (e.g., the second coupler 219 of FIGS. 2A and 2B), a second switch (e.g., the second switch 221 of FIGS. 2A and 2B), a first filter 411, a second filter 413, or a third filter 415.

The power management module 188 may manage power supplied to the electronic device 101. The power management module 188 may supply power (VPH_PWR) to the first power supplier 370 or the second power supplier 375.

According to an embodiment, the first power supplier 370 may receive power supplied from the power management module 188, and receive an envelope (Tx envelop waveform 1) from the processor 120. The first power supplier 370 may provide power (Vcc) corresponding to the envelope to the communication circuit 330 by using the supplied power. The first power supplier 370 may be a component for providing a voltage applied to the first amplifier 211. The power corresponding to the envelope may be provided to the first amplifier 211 included in the transmission circuit 210 of the communication circuit 330.

According to an embodiment, the second power supplier 375 may receive power supplied from the power management module 188, and receive an envelope (Tx envelop waveform 2) from the processor 120. The second power supplier 375 may provide power (Vcc) corresponding to the envelope to the communication circuit 330 by using the supplied power. The second power supplier 375 may be a component for providing a voltage applied to the second amplifier 217. The power corresponding to the envelope may be provided to the second amplifier 217 included in the transmission circuit 210 of the communication circuit 330.

The processor 120 may generate an RF signal to be input to the first amplifier 211. The generated RF signal may be transferred to the transceiver 310. The processor 120 may determine the magnitude of the RF signal, based on a signal control table stored in a memory (e.g., the memory 130 of FIG. 1). The signal control table may include transmission output power (or a code value) corresponding to the magnitude of power of the RF signal.

According to an embodiment, the processor 120 may determine whether to use the first amplifier 211 or use the first amplifier 211 and the second amplifier 217, based on the magnitude (or the magnitude of power) of the RF signal (e.g., the amplified RF signal) output (or transmitted) through the first antenna 250 or the second antenna 255. The processor 120 may determine to use the first amplifier 211 when the power (or the magnitude of the power) of the output RF signal is equal to or less than a reference value, and determine to use the first amplifier 211 and the second amplifier 217 when the power (or the magnitude of the power) of the output RF signal is greater than the reference value.

During the ET operation, the processor 120 may transfer the envelope to the first power supplier 370, based on an envelope of the signal input from the transceiver 310 to the first amplifier 211. The processor may transfer the envelope to at least one of the first power supplier 370 and the second power supplier 375, based on the determined amplifier (or the number of amplifiers). For example, the processor 120 may transfer the envelope to the first power supplier 370 when the first amplifier 211 is used. The processor 120 may transfer the envelope to the first power supplier and the second power supplier 375 when the first amplifier 211 and the second amplifier 217 are used.

According to an embodiment, the processor 120 may control the first switch 215 and the second switch 221, based on the determined amplifier (or the number of amplifiers). FIG. 6A illustrates the processor 120, but the processor 120 may indicate a communication processor included in a communication module (e.g., the communication module 190 of FIG. 1).

According to an embodiment, the processor 120 may determine a first transmission path when the first amplifier 211 is used, and control the first switch 215 and the second switch 221, based on the first transmission path. For example, in the first transmission path, the first switch 215 may be switched so that the signal output from the second port of the first coupler 213 is input to the second switch 221. In the first transmission path, the second switch 221 may be switched so that the signal transferred from the first switch 215 is output. The signal output from the second switch 221 may be input to the transceiver 310 through a second line (or port) 403.

According to an embodiment, when the first amplifier 211 and the second amplifier 217 are used, the processor 120 may control the signal output from the second port of the first coupler 213 to be input to the second amplifier 217. When the first amplifier 211 and the second amplifier 217 are used, the processor 120 may determine a second transmission path, and control the first switch 215 and the second switch 221, based on the second transmission path. For example, in the second transmission path, the first switch 215 may be switched so that the signal output from the second port of the first coupler 213 is input to the second amplifier 217.

The transceiver 310 may correspond to an RFIC, and during transmission, may convert a baseband signal generated by the processor 120 into a radio frequency (RF) signal (e.g., a Tx signal) corresponding to a designated frequency band. The converted radio frequency signal corresponds to a signal to be transmitted through the first antenna 250 or the second antenna 255, and may be input as an input signal of the transmission circuit 210 through a first line (or port) 401. The transceiver 310 may control the magnitude of the power of the RF signal, based on a signal output from the second switch 221. Alternatively, the transceiver 310 may transfer the signal output from the second switch 221 to the processor 120, and receive a control signal for controlling the magnitude of the power of the RF signal in the transceiver 310 from the processor 120, and the transceiver 310 may provide, as an input signal of the transmission circuit 210, an RF signal according to the control signal.

During the transmission, the transceiver 310 may transfer the converted radio frequency signal (e.g., a Tx signal) to the transmission circuit 210. During reception, the transceiver 310 may acquire a radio frequency signal (e.g., an Rx signal) received from the first antenna 250 or the second antenna 255, through the reception circuit 350, and convert the acquired radio frequency signal into a baseband signal. During the reception, the transceiver 310 may transfer the converted baseband signal to the processor 120.

The communication circuit 330 may amplify a radio frequency signal to be transmitted through the first antenna 250 or the second antenna 255, or may amplify a radio frequency signal received from the first antenna 250 or the second antenna 255. The transmission circuit 210 included in the communication circuit 330 may amplify a radio frequency signal to be transmitted through the first antenna 250.

The first amplifier 211 may acquire, as an input signal, a radio frequency signal to be transmitted through the antenna 250, from the transceiver 310, and amplify the acquired RF signal. According to various embodiments, at least one of an ET technology, an APT technology, and an SPT technology may be applied to the first amplifier 211. The first amplifier 211 may receive power supplied from the first power supplier 370, and use the same to amplify the RF signal.

The amplified RF signal (e.g., the first amplifier output signal) may be input to the first coupler 213. According to various embodiments, the first amplifier output signal may be input to the first coupler 213 through the first filter 411. The first filter 411 may be disposed between the first amplifier 211 and the first coupler 213, and filter the RF signal amplified by the first amplifier 211. The first coupler 213 may output most of the amplified RF signal to a first port, and output at least a part of the amplified RF signal to a second port. The signal output from the first port may be input to the first antenna 250, and the signal output from the second port may be input to the first switch 215 to be used for power measurement of the transceiver 310. The signal input to the first antenna 250 may be output (or propagated) to the outside.

According to an embodiment, the first switch 215 may be disposed in a line output from the second port of the first coupler 213, and the second switch 221 may be disposed in an input line (e.g., the second line 403) of the transceiver 310. The first switch 215 may include one input port and two output ports. For example, the input port of the first switch 215 may be connected to a second port of the first coupler 213. A first output port of the first switch 215 may be selectively connected to one of the input port of the second amplifier 217 and the input port of the second switch 221. The second switch 221 may include two input ports and one output port. For example, the input port of the second switch 221 may be connected to one of the output port of the first switch 215 and a second port of the second coupler 219. The output port of the second switch 221 may be connected to the input port (e.g., the second line 403) of the transceiver 310.

According to an embodiment, when the first amplifier 211 is used, the output signal of the first switch 215 may be input as an input signal of the second switch 221, and the output signal of the second switch 221 may be transferred (or input) to the transceiver 310. When the first amplifier 211 and the second amplifier 217 are used, the output signal of the first switch 215 may be utilized as an input signal of the second amplifier 217. According to various embodiments, the output signal of the first switch 215 may be input to the second amplifier 217 through the second filter 413. The second filter 413 may be disposed between the first switch 215 and the second amplifier 217, and filter a signal (e.g., a signal output to the second port of the first coupler 213) output from the first switch 215. According to the implementation of the electronic device 101 in various embodiments, the second filter 413 may be omitted.

According to an embodiment, the second amplifier 217 may acquire the output signal of the first switch 215 (e.g., the signal output to the second port of the first coupler 213), and amplify the acquired signal. The RF signal amplified through the second amplifier 217 (e.g., the second amplifier output signal) may be input to the second coupler 219. According to various embodiments, the second amplifier output signal may be input to the second coupler 219 through the third filer 415. The third filter 415 may be disposed between the second amplifier 217 and the second coupler 219, and filter the RF signal amplified by the second amplifier 217 (e.g., the second amplifier output signal).

According to an embodiment, the second coupler 219 may output most of the second amplifier output signal to the first port, and output at least a part of the second amplifier output signal to the second port. The signal output from the first port may be input to the second antenna 255, and the signal output from the second port may be input to the second switch 221 to be used for power measurement of the transceiver 310. In the second transmission path, the second switch 221 may be switched so that the signal output from the second port of the second coupler 219 is output. The signal output from the second switch 221 may be input to the transceiver 310. The signal input to the second antenna 255 may be output (or propagated) to the outside.

When the first amplifier 211 and the second amplifier 217 are used, the first amplifier output signal output from the first amplifier 211 may be output to the outside through the first antenna 250, and the second amplifier output signal output from the second amplifier 217 may be output to the outside through the second antenna 255.

FIG. 6B illustrates a first transmission path when a first amplifier is used in a second circuit diagram related to communication of an electronic device according to various embodiments. FIG. 6B is a $(2\text{-}1)^{th}$ circuit diagram 630 illustrating a first transmission path (e.g., a first signal output path 610 or a first signal transmission path 620) in the second circuit diagram 600 of FIG. 6A.

Referring to FIG. 6B, in the $(2\text{-}1)^{th}$ circuit diagram 630, the electronic device 101 may include at least one of a power management module 188, a first power supplier 370, a second supplier 375, a processor 120, a transceiver 310, a communication circuit 330, a first antenna 250, or a second antenna 255. The communication circuit 330 may include a transmission circuit 210. The transmission circuit 210 may include at least one of a first amplifier 211, a first coupler 213, a second switch 215, a second amplifier 217, a second coupler 219, or a second switch 221. The description of elements identical or similar to those in FIG. 6A will be simply made.

The power management module 188 may manage power supplied to the electronic device 101. The power management module 188 may supply power (VPH_PWR) to the first power supplier 370. In an embodiment, the first power supplier 370 may receive power supplied from the power management module 188, and receive an envelope (Tx envelop waveform 1) from the processor 120. The first power supplier 370 may provide power (Vcc) corresponding to the envelope to the communication circuit 330 by using the supplied power. The power corresponding to the envelope may be provided to the first amplifier 211 included in the transmission circuit 210 of the communication circuit 330. The second power supplier 375 may receive power supplied from the power management module 188, and receive an envelope (Tx envelop waveform 2) from the processor 120. The second power supplier 375 may provide power (Vcc) corresponding to the envelope to the communication circuit 330 by using the supplied power. The power corresponding to the envelope may be provided to the second amplifier 217 included in the transmission circuit 210 of the communication circuit 330.

According to an embodiment, the processor 120 may generate an RF signal to be input to the first amplifier 211. The generated RF signal may be transferred to the transceiver 310. During the ET operation, the processor 120 may transfer the envelope to the first power supplier 370, based on an envelope of the signal input from the transceiver 310 to the first amplifier 211. Alternatively, the processor 120 may transfer the envelope to the second power supplier 375.

According to an embodiment, the processor 120 may determine a first transmission path when the first amplifier 211 is used, and control the first switch 215 and the second switch 221, based on the first transmission path. For example, the first transmission path may include the first signal output path 610 or the first signal transmission path 620. In the first signal output path 610, the first amplifier output signal output from the first amplifier 211 may be output to the outside through the first antenna 250. In the first signal transmission path 620, at least a part of the first amplifier output signal output from the first amplifier 211 may be transferred to the transceiver 310 to be used for power measurement of the transceiver 310.

The first amplifier 211 may acquire, as an input signal, an RF signal to be transmitted through the antenna 250, from the transceiver 310, and amplify the acquired RF signal. The amplified RF signal may be input to the first coupler 213. The first coupler 213 may output most of the amplified RF signal to a first port, and output at least a part of the amplified RF signal to a second port. The signal output from the first port may be input to the first antenna 250, and the signal output from the second port may be input to the first switch 215.

According to an embodiment, in the first transmission path, the output signal of the first switch 215 may be controlled to be used as an input signal of the second switch 221. In the first signal output path 610, the first amplifier output signal output from the first amplifier 211 may be transferred to the first antenna 250 through the first filter 411 and the first coupler 213 (e.g., the first port of the first coupler 213). In the first signal transmission path 620, the first amplifier output signal output from the first amplifier 211 may be input to the second switch 221 through the first filter 411 and the first coupler 213 (e.g., the second port of the first coupler 213). In the first transmission path, the second switch 221 may be switched so that the signal transferred from the first switch 215 is output. The signal output from the second switch 221 may be input to the transceiver 310 through a second line (or port) 403.

The circuit diagram of FIG. 6 may be slightly different from that of FIG. 4B, and the first transmission path may be identical or similar to each other.

FIG. 6C illustrates a second transmission path when a first amplifier and a second amplifier are used in a second circuit diagram related to communication of an electronic device according to various embodiments. FIG. 6C is a $(2\text{-}2)^{th}$ circuit diagram 650 illustrating a second transmission path (e.g., a $(2\text{-}1)^{th}$ signal output path 660, a $(2\text{-}2)^{th}$ signal output path 665, or a second signal transmission path 670) in the second circuit diagram 600 in FIG. 6A.

Referring to FIG. 6C, in the $(2\text{-}2)^{th}$ circuit diagram 650, the electronic device 101 may include at least one of a power management module 188, a first power supplier 370, a second power amplifier 375, a processor 120, a transceiver 310, a communication circuit 330, a first antenna 250, or a second antenna 255. The communication circuit 330 may include a transmission circuit 210. The transmission circuit 210 may include at least one of a first amplifier 211, a first coupler 213, a second switch 215, a second amplifier 217, a second coupler 219, or a second switch 221. The description of elements identical or similar to those in FIG. 6A will be simply made.

The power management module 188 may manage power supplied to the electronic device 101. The power management module 188 may supply power (VPH_PWR) to the first power supplier 370.

According to an embodiment, the first power supplier 370 may receive power supplied from the power management module 188, and receive an envelope (Tx envelop waveform 1) from the processor 120. The first power supplier 370 may provide power (Vcc) corresponding to the envelope to the communication circuit 330 by using the supplied power. The power corresponding to the envelope may be provided to the first amplifier 211 included in the transmission circuit 210 of the communication circuit 330.

According to an embodiment, the second power supplier 375 may receive power supplied from the power management module 188, and receive an envelope (Tx envelop waveform 2) from the processor 120. The second power supplier 375 may provide power (Vcc) corresponding to the envelope to the communication circuit 330 by using the supplied power. The power corresponding to the envelope may be provided to the second amplifier 217 included in the transmission circuit 210 of the communication circuit 330.

The processor 120 may generate an RF signal to be input to the first amplifier 211. The generated RF signal may be transferred to the transceiver 310. During the ET operation, the processor 120 may transfer the envelope to the first power supplier 370, based on an envelope of the signal input from the transceiver 310 to the first amplifier 211.

According to an embodiment, the processor 120 may determine a second transmission path when the first amplifier 211 and the second amplifier 217 are used, and control the first switch 215 and the second switch 221, based on the second transmission path. For example, the second transmission path may include the $(2\text{-}1)^{th}$ signal output path 660, the $(2\text{-}2)^{th}$ signal output path 665, or the second signal transmission path 670. In the $(2\text{-}1)^{th}$ signal output path 660, the first amplifier output signal output from the first amplifier 211 may be output to the outside through the first antenna 250. In the $(2\text{-}2)^{th}$ signal output path 665, the second amplifier output signal output from the second amplifier 217 may be output to the outside through the second antenna 255. In the second signal transmission path 670, at least a part of the second amplifier output signal output from the second amplifier 217 may be transferred to the transceiver 310 to be used for power measurement of the transceiver 310.

According to an embodiment, in the (2-1)$^{th}$ signal output path 660, the first amplifier output signal output from the first amplifier 211 may be transferred to the first antenna 250 through the first filter 411 and the first coupler 213 (e.g., the first port of the first coupler 213). The first amplifier 211 may acquire, from the transceiver 310, a radio frequency signal to be transmitted through the first antenna 250, as an input signal, and amplify the acquired RF signal. The amplified RF signal (e.g., the first amplifier output signal) may be input to the first coupler 213. The first coupler 213 may output most of the first amplifier output signal to a first port, and output at least a part of the first amplifier output signal to a second port. The signal output from the first port may be input to the first antenna 250, and the signal output from the second port may be input to the first switch 215. The signal input to the first antenna 250 may be output to the outside.

According to an embodiment, in the (2-2)$^{th}$ signal output path 665, the signal having gone through the first coupler 213 (e.g., the second port of the first coupler 213) and the first switch 215 may be input to the second amplifier 217, and the signal having been amplified through the second amplifier 217 may be transferred to the second antenna 255 through the second coupler 219. In the (2-2)$^{th}$ signal output path 665, the output signal of the first switch 215 may be controlled to be used as an input signal of the second amplifier 217. According to various embodiments, the output signal of the first switch 215 may be input to the second amplifier 217 through the second filter 413. The second filter 413 may be disposed between the first switch 215 and the second amplifier 217, and filter a signal (e.g., the signal output to the second port of the first coupler 213) output from the first switch 215. According to the implementation of the electronic device 101 in various embodiments, the second filter 413 may be omitted.

According to an embodiment, the second amplifier 217 may acquire the output signal of the first switch 215 (e.g., the signal output to the second port of the first coupler 213), and amplified the acquired signal. The RF signal amplified by the second amplifier 217 (e.g., the second amplifier output signal) may be input to the second coupler 219. According to various embodiments, the second amplifier output signal may be input to the second coupler 219 through the third filter 415. The third filter 415 may be disposed between the second amplifier 217 and the second coupler 219, and filter the second amplifier output signal.

According to an embodiment, the second coupler 219 may output most of the second amplifier output signal to a first port, and output at least a part of the second amplifier output signal to a second port. The signal output to the first port may be input to the second antenna 255, and the signal output to the second port may be input to the second switch 221. The second amplifier input to the second antenna 255 may be output (or propagated) to the outside.

According to an embodiment, in the second signal transmission path 670, at least a part of the second amplifier output signal may be output to the second port of the second coupler 219, input as an input signal of the second switch 221 from the second port of the second coupler 219, and output to the second switch 221. The signal output from the second switch 221 may be input to the transceiver 310 through a second line (or port) 403.

An electronic device (e.g., the electronic device 101 of FIG. 1) according to various embodiments of the disclosure may include an antenna (e.g., the antenna module 197 of FIG. 1 and the first antenna 250 of FIGS. 2A and 2B), a communication circuit (e.g., the transmission circuit 210 of FIGS. 2A and 2B and the communication circuit 330 of FIG. 3) including a first amplifier (e.g., the first amplifier 211 of FIGS. 2A and 2B) configured to amplify a radio frequency signal to be transmitted through the antenna, a first coupler (e.g., the first coupler 213 of FIGS. 2A and 2B) connected to the first amplifier and configured to output a first amplifier output signal output from the first amplifier, to the antenna through a first port, and output at least a part of the first amplifier output signal to a first switch through a second port, the first switch (e.g., the first switch 215 of FIGS. 2A and 2B) connected to the second port of the first coupler and configured to switch the at least a part of the first amplifier output signal, output from the second port of the first coupler, to a second amplifier (e.g., the second amplifier 217 of FIGS. 2A and 2B) or a second switch, and the second amplifier configured to acquire the at least a part of the first amplifier output signal, output from the first switch, as an input signal, and amplify the same, and a processor (e.g., the processor 120 of FIG. 1) operably connected to the antenna and the communication circuit, wherein the processor is configured to control the first switch and the second switch so that the first amplifier is used, or the first amplifier and the second amplifier are used, based on a magnitude of the first amplifier output signal.

The second amplifier may be configured to amplify a signal output from the first switch and output a second amplifier output signal, and the communication circuit may be configured to further include a second coupler (e.g., the second coupler 219 of FIGS. 2A and 2B) connected to the second amplifier and configured to output a second amplifier output signal output from the second amplifier, through a first port so that the second amplifier output signal is combined with the first amplifier output signal, and output at least a part of the second amplifier output signal to a second switch through a second port, and the second switch (e.g., the second switch 221 of FIGS. 2A and 2B) connected to the first switch and the second port of the second coupler and configured to perform switching to one of an output port of the first switch and the second port of the second coupler.

When the first amplifier is used, the processor may be configured to determine a first transmission path, and control the first switch and the second switch, based on the first transmission path.

The processor may be configured to control the first switch and the second switch so that the first amplifier output signal output from the first amplifier is output to the outside through the antenna, and an output signal of the first switch is input as an input signal of the second switch.

The communication circuit may further include a first filter (e.g., the first filter 411 of FIGS. 4A to 4C) disposed between the first amplifier and the first coupler, wherein in the first transmission path, the first amplifier output signal output from the first amplifier is input to the first antenna through the first filter and the first coupler.

The processor may be configured to determine a second transmission path when the first amplifier and the second amplifier are used, and control the first switch and the second switch, based on the second transmission path.

The processor may control the first switch so that an output signal of the first switch is input as an input signal of the second amplifier, and control the first amplifier output signal output from the first amplifier and the second amplifier output signal output from the second amplifier to be combined with each other and output to the outside through the antenna.

The communication circuit may further include a phase shifter (e.g., the phase shifter 223 of FIG. 2A) connected to the first coupler and the second coupler and configured to perform phase shifting of the output signal of the first port of the second coupler, and the processor may control the first amplifier output signal output from the first amplifier and a second amplifier output signal output from the phase shifter to be combined with each other and output to the outside through the antenna.

The communication circuit may further include a second filter (e.g., the second filter 413 of FIGS. 4A to 4C) disposed between the second amplifier and the second coupler, wherein in the second transmission path, at least a part of the first amplifier output signal output from the first amplifier is input to the second amplifier, and the second amplifier output signal output from the second amplifier is combined with the first amplifier output signal output from the first amplifier, through the second filter and the second coupler, and input to the antenna.

The antenna may be a first antenna, the electronic device may further include a second antenna (e.g., the second antenna 255 of FIG. 2B), and the processor may control, when the first amplifier is used, the first amplifier output signal output from the first amplifier to be output to the outside through the first antenna, and control, when the first amplifier and the second amplifier are used, the first amplifier output signal output from the first amplifier to be output to the outside through the first antenna, and the second amplifier output signal output from the second amplifier to be output to the outside through the second antenna.

When the first amplifier and the second amplifier are used, the processor may be configured to control the first switch so that an output signal of the first switch is input as an input signal of the second amplifier, and control the second switch so that a part of an output signal of the second amplifier, output from the second amplifier, is input as an input signal of the second switch.

The electronic device may further include a first power supplier (e.g., the first power supplier 370 of FIG. 3) configured to receive power supplied from a power management module of the electronic device and provide first power to the first amplifier upon control by the processor, and a second power supplier (e.g., the second power supplier 375 of FIG. 5) configured to receive power supplied from the power management module of the electronic device and provide second power to the second amplifier upon control by the processor.

The electronic device may further include a transceiver (e.g., the transceiver 310 of FIG. 3) connected to the second switch and configured to acquire an output signal of the second switch, and the processor may be configured to acquire the output signal of the second switch through the transceiver, and control the first switch and the second switch so that the first amplifier is used, or the first amplifier or the second amplifier are used, based on the output signal of the second switch.

The communication circuit may correspond to a transmission circuit configured to amplify a radio frequency signal to be transmitted through the antenna.

A communication circuit (e.g., the transmission circuit 210 of FIGS. 2A and 2B and the communication circuit 330 of FIG. 3) including a transmission circuit configured to amplify a radio frequency signal to be transmitted through an antenna of an electronic device, and a reception circuit configured to amplify a radio frequency signal received from the antenna may include a first amplifier (e.g., the first amplifier 211 of FIGS. 2A and 2B) configured to amplify a radio frequency signal to be transmitted through the antenna, a first coupler (e.g., the first coupler 213 of FIGS. 2A and 2B) connected to the first amplifier and configured to output a first amplifier output signal output from the first amplifier to the antenna through a first port and output at least a part of the first amplifier output signal to a first switch through a second port, the first switch (e.g., the first switch 215 of FIGS. 2A and 2B) connected to the second port of the first coupler and configured to switch the at least a part of the first amplifier output signal, output from the second port of the first coupler, to a second amplifier or a second switch, and the second amplifier (e.g., the second amplifier 217 of FIGS. 2A and 2B) configured to acquire the at least a part of the first amplifier output signal, output from the first switch, as an input signal, and amplify the same.

The communication circuit may be configured to further include a second coupler (e.g., the second coupler 219 of FIGS. 2A and 2B) connected to the second amplifier and configured to output a second amplifier output signal output from the second amplifier, through a first port so that the second amplifier output signal is to be combined with the first amplifier output signal, and output at least a part of the second amplifier output signal to a second switch through a second port, and the second switch (e.g., the second switch 221 of FIGS. 2A and 2B) connected to the first switch and the second port of the second coupler and configured to perform switching to one of an output port of the first switch and the second port of the second coupler.

The communication circuit may be configured to, when the first amplifier is used, cause the first amplifier output signal output from the first amplifier to be output to the outside through the antenna, and cause the first switch and the second switch to be controlled so that the at least a part of the first amplifier output signal, output from the first switch, is input as an input signal of the second switch, upon control by a processor of the electronic device.

The communication circuit may be configured to, when the first amplifier and the second amplifier are used, cause the first switch to be controlled so that the at least a part of the first amplifier output signal, output from the first switch, is input as an input signal of the second amplifier, and cause the first amplifier output signal output from the first amplifier and the second amplifier output signal output from the second amplifier to be combined with each other and output to the outside through the antenna.

When the electronic device includes a first antenna and a second antenna, the communication circuit may be configured to, when the first amplifier and the second amplifier are used, cause the first amplifier output signal output from the first amplifier to be output to the outside through the first antenna, to cause the first switch to be controlled so that the at least a part of the first amplifier output signal, output from the first switch, is input as an input signal of the second amplifier, upon control by a processor of the electronic device, and cause the second amplifier output signal output from the second amplifier to be output to the outside through the second antenna.

Figure 7:
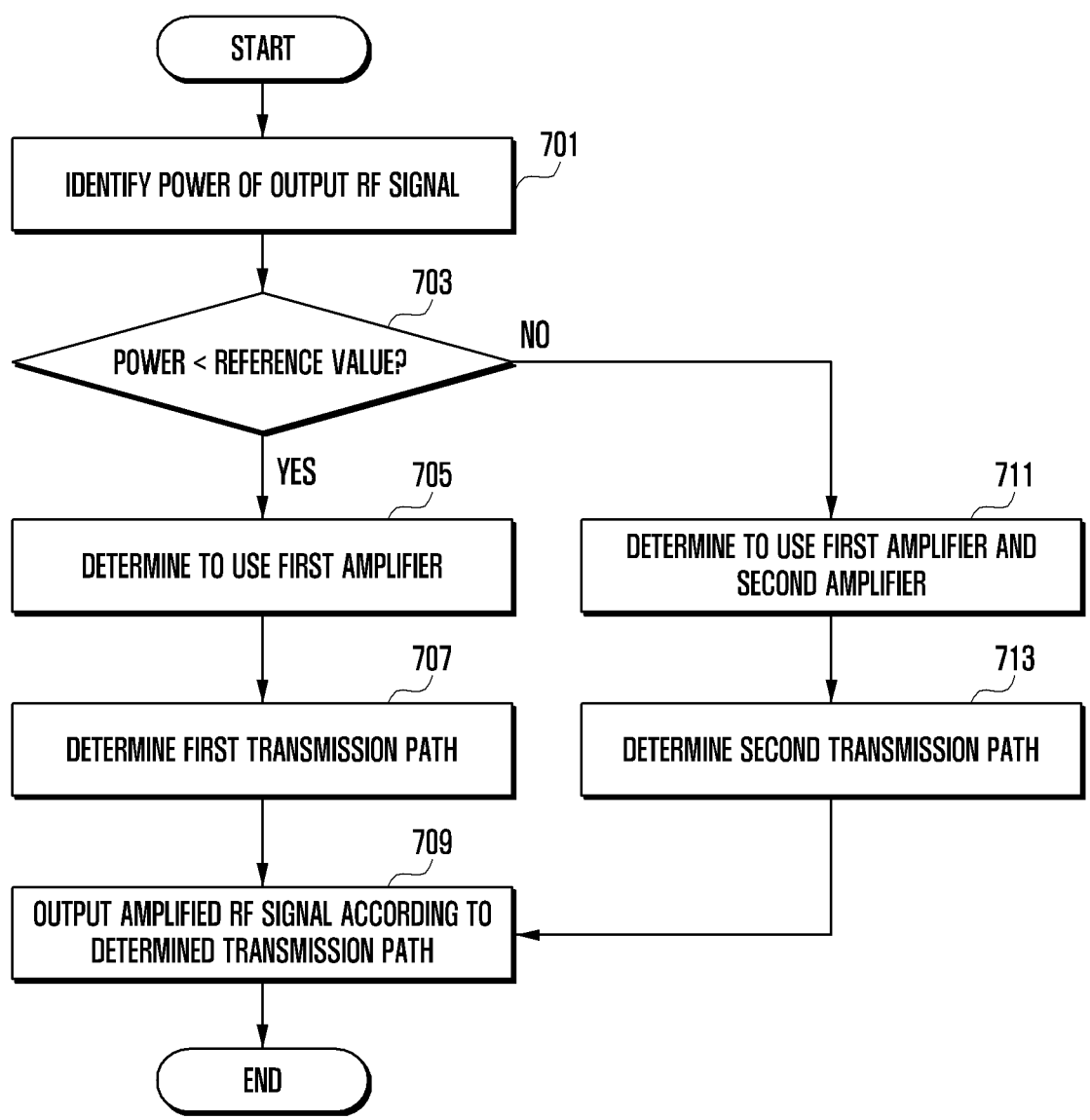
FIG. 7 is a flowchart illustrating an operation method of an electronic device according to various embodiments.

FIG. 7 is a flowchart 700 illustrating an operation method of an electronic device according to various embodiments.

Referring to FIG. 7, in operation 701, a processor (e.g., the processor 120 of FIG. 1) of an electronic device (e.g., the electronic device 101 of FIG. 1) according to various embodiments may identify the magnitude of power of an output RF signal. FIG. 7 illustrates that the operation is performed by the processor 120, but the processor 120 may indicate a communication processor included in a communication module (e.g., the communication module 190 of FIG. 1). The processor 120 may generate a baseband signal corresponding to an RF signal to be transmitted through an antenna (e.g., the first antenna module 197 of FIG. 1 and the first antenna 250), and transfer the generated baseband signal to a transceiver (e.g., the transceiver 310 of FIG. 3). The transceiver 310 may convert the baseband signal to an RF signal, and input the converted RF signal to an amplifier (e.g., the first amplifier 211 of FIGS. 2A and 2B). The first amplifier 211 may amplify the RF signal. The output RF signal may mean an RF signal output through the first antenna 250 or a first amplifier output signal output from the first amplifier 211. In another example, the output RF signal may mean the RF signal output through the first antenna 250 or the RF signal amplified by a second amplifier (e.g., the second amplifier 217 of FIGS. 2A and 2B), for example, a second amplifier output signal output from the second amplifier 217.

In operation 703, the processor 120 may determine whether the power (or the magnitude of the power) of the output RF signal is equal to or less than a reference value. When the power of the output RF signal is equal to or less than the reference value, the processor 120 may perform operation 707, and when the power of the output RF signal is greater than the reference value, the processor 120 may perform operation 713.

When the power of the output RF signal is equal to or less than the reference value, the processor 120 may determine in operation 705 to use a first amplifier (e.g., the first amplifier 211 of FIGS. 2A and 2B). When the power of the output RF signal is equal to or less than the reference value, it may mean that a transmission signal is transmitted at lower transmission power. When the low transmission power is required, the processor 120 may control only the first amplifier 211 to be used.

In operation 707, the processor 120 may determine a first transmission path. The processor 120 may determine a first transmission path when the first amplifier 211 is used, and control a first switch (e.g., the first switch 215 of FIGS. 2A and 2B) and a second switch (e.g., the second switch 221 of FIGS. 2A and 2B), based on the first transmission path. For example, in the first transmission path, the first switch 215 may be switched so that the signal output to the second port of the first coupler 213 is input to the second switch 221. In the first transmission path, the second switch 221 may be switched so that the signal transferred from the first switch 215 is output. The signal output from the second switch 221 may be input to a transceiver (e.g., the transceiver 310 of FIG. 3).

In operation 709, the processor 120 may output (or transmit) the amplified RF signal according to the determined transmission path. For example, the processor 120 may control the first amplifier output signal output from the first amplifier 211 to be output to the outside through the first antenna 250 according to the first transmission path in the first circuit diagram 400 or the second circuit diagram 600. In the first circuit diagram 400, the first transmission path may be the first signal output path 440 or the first signal transmission path 445 of FIG. 4B (e.g., (1-1)$^{th}$ circuit diagram 430), or the first signal output path 610 or the first signal transmission path 620 of FIG. 6B (e.g., (2-1)$^{th}$ circuit diagram 630).

The detailed description of the first transmission path has been made through FIGS. 4B and 6B, and a further detailed description may be omitted.

According to an embodiment, the processor 120 may control the first amplifier output signal output from the first amplifier 211 and the second amplifier output signal output from the second amplifier 217 to be combined and output to the outside through the first antenna 250 according to a second transmission path in the first circuit diagram 400. The second transmission path in the first circuit diagram 400 may be the second signal output path 460 or the second signal transmission path 465 of FIG. 4C (e.g., (1-2)$^{th}$ circuit diagram 450).

The processor 120 may control the first amplifier output signal output from the first amplifier 211 to be output to the outside through the first antenna 250, and the second amplifier output signal from the second amplifier 217 to be output to the outside through the second antenna 255 according to the second transmission path in the second circuit diagram 600. In the second circuit diagram 600, the second transmission path may be the (2-1)$^{th}$ signal output path 660, the (2-2)$^{th}$ signal output path 665, or the second signal transmission path 670 of FIG. 6C (e.g., (2-2)$^{th}$ circuit diagram 650).

The detailed description of the second transmission path has been made through FIGS. 4C and 6C, and a further detailed description may be omitted.

When the power of the output RF signal is greater than the reference value, the processor 120 may determine in operation 711 to use the first amplifier and the second amplifier (e.g., the second amplifier 217 of FIGS. 2A and 2B). When the power of the output RF signal is greater than the reference value, it may mean that a transmission signal should be transmitted at high transmission power. When the high transmission power is required, the processor 120 may control the first amplifier 211 and the second amplifier 217 to be used.

In operation 713, the processor 120 may determine a second transmission path. When the first amplifier 211 and the second amplifier 217 are used, the processor 120 may determine a second transmission path, and control the first switch 215 and the second switch 221, based on the second transmission path. For example, in the second transmission path, the first switch 215 may be switched so that the signal output to the second port of the first coupler 213 is input to the second amplifier 217. In the second transmission path, the second switch 221 may be switched so that at least a part of the second amplifier output signal output from the second amplifier 217 is output through the second port of the second coupler 219. The signal output from the second switch 221 may be input to the transceiver 310.

An operation method of an electronic device (e.g., the electronic device 101 of FIG. 1) according to various embodiments of the disclosure may include monitoring a magnitude of a radio frequency signal output through an antenna of the electronic device, and controlling a first amplifier (e.g., the first amplifier 211 of FIGS. 2A and 2B) included in a communication circuit (e.g., the transmission circuit 210 of FIGS. 2A and 2B and the communication circuit 330 of FIG. 3) of the electronic device to be used, or controlling the first amplifier and a second amplifier (e.g., the second amplifier 217 of FIGS. 2A and 2B) included in the communication circuit to be used, based on the magnitude of the output radio frequency signal, wherein the communication circuit includes the first amplifier configured to amplify a radio frequency signal to be transmitted through the antenna, a first coupler (e.g., the first coupler 213 of FIGS. 2A and 2B) connected to the first amplifier and configured to output a first amplifier output signal output from the first amplifier, to the antenna through a first port, and output at least a part of the first amplifier output signal to a first switch through a second port, the first switch (e.g., the first switch 215 of FIGS. 2A and 2B) connected to the second port of the first coupler and configured to switch the at least a part of the first amplifier output signal, output from the second port of the first coupler, to a second amplifier or a second switch, and the second amplifier configured to acquire the at least a part of the first amplifier output signal, output from the first switch, as an input signal, and amplify the same.

Various embodiments of the disclosure described and shown in the specification and the drawings have presented specific examples in order to easily explain the technical contents and help understanding of the disclosure, and are not intended to limit the scope of the disclosure. Therefore, the scope of the disclosure should be construed to include, in addition to the embodiments disclosed herein, all changes or modifications.

What is claimed is:

1. An electronic device comprising:
   an antenna;
   a communication circuit comprising:
      a first amplifier configured to amplify a radio frequency signal to be transmitted through the antenna;
      a first coupler connected to the first amplifier and configured to output a first amplifier output signal output from the first amplifier, to the antenna through a first port of the first coupler, and output at least a part of the first amplifier output signal to a first switch through a second port of the first coupler;
      the first switch connected to the second port of the first coupler and configured to switch the at least a part of the first amplifier output signal, output from the second port of the first coupler, to a second amplifier or a second switch; and
      the second amplifier configured to amplify the at least a part of the first amplifier output signal, output from the first switch; and
   a processor operably connected to the antenna and the communication circuit,
   wherein the processor is configured to, based on a magnitude of the first amplifier output signal, control the first switch and the second switch to use the first amplifier, or to use the first amplifier and the second amplifier.

2. The electronic device of claim 1, wherein the second amplifier is further configured to output a second amplifier output signal by amplifying a signal output from the first switch, and
   wherein the communication circuit further comprises:
      a second coupler connected to the second amplifier and configured to output the second amplifier output signal output from the second amplifier, through a first port of the second coupler, to be combined with the first amplifier output signal, and output at least a part of the second amplifier output signal to the second switch through a second port of the second coupler; and
      the second switch connected to the first switch and the second port of the second coupler and configured to perform switching to one of an output port of the first switch and the second port of the second coupler.

3. The electronic device of claim 2, wherein the processor is further configured to
   determine a first transmission path when the first amplifier is used, and
   control the first switch and the second switch, based on the first transmission path.

4. The electronic device of claim 3, wherein the processor is further configured to control the first switch and the second switch such that:
   the first amplifier output signal output from the first amplifier is output to an outside through the antenna, and
   an output signal of the first switch is input as an input signal of the second switch.

5. The electronic device of claim 3, wherein the communication circuit further comprises a first filter disposed between the first amplifier and the first coupler, and
   wherein in the first transmission path, the first amplifier output signal output from the first amplifier is input to the antenna through the first filter and the first coupler.

6. The electronic device of claim 2, wherein the processor is further configured to:
   determine a second transmission path when the first amplifier and the second amplifier are used, and
   control the first switch and the second switch, based on the second transmission path.

7. The electronic device of claim 6, wherein the processor is further configured to:
   control the first switch such that an output signal of the first switch is input as an input signal of the second amplifier, and
   controls the first amplifier output signal output from the first amplifier and the second amplifier output signal output from the second amplifier to be combined with each other and output to an outside through the antenna.

8. The electronic device of claim 7, wherein the communication circuit further comprises a phase shifter connected to the first coupler and the second coupler and configured to perform phase shifting of an output signal of the first port of the second coupler, and
   wherein the processor is further configured to control the first amplifier output signal output from the first amplifier and a second amplifier output signal, on which the phase shifting of the phase shifter has been performed, to be combined with each other and output to the outside through the antenna.

9. The electronic device of claim 6, wherein the communication circuit further comprises a second filter disposed between the second amplifier and the second coupler, and
   wherein in the second transmission path, at least a part of the first amplifier output signal output from the first amplifier is input to the second amplifier, and the second amplifier output signal output from the second amplifier is combined with the first amplifier output signal output from the first amplifier, through the second filter and the second coupler, and input to the antenna.

10. The electronic device of claim 2, wherein the antenna is a first antenna, and the electronic device further comprises a second antenna, and
    wherein the processor is further configured to:
       control, based on the first amplifier being used and the second amplifier not being used, the first amplifier output signal output from the first amplifier to be output to an outside through the first antenna, and
       control, based on the first amplifier and the second amplifier being used, the first amplifier output signal output from the first amplifier to be output to the outside through the first antenna, and the second amplifier output signal output from the second amplifier to be output to the outside through the second antenna.

11. The electronic device of claim 10, wherein when the processor is further configured to, based on the first amplifier and the second amplifier being used, control the first switch such that an output signal of the first switch is input as an input signal of the second amplifier, and control the second switch such that a part of an output signal of the second amplifier, output from the second amplifier, is input as an input signal of the second switch.

12. The electronic device of claim 10, further comprising:
a first power supplier configured to receive power supplied from a power management module of the electronic device and provide first power to the first amplifier upon control by the processor; and
a second power supplier configured to receive power supplied from the power management module of the electronic device and provide second power to the second amplifier upon control by the processor.

13. The electronic device of claim 2, further comprising a transceiver connected to the second switch and configured to acquire an output signal of the second switch,
wherein the processor is further configured to acquire the output signal of the second switch through the transceiver, and control the first switch and the second switch so that the first amplifier is used, or the first amplifier or the second amplifier are used, based on the output signal of the second switch.

14. The electronic device of claim 2, wherein the communication circuit corresponds to a transmission circuit configured to amplify a radio frequency signal to be transmitted through the antenna.

15. A communication circuit comprising a transmission circuit configured to amplify a radio frequency signal to be transmitted through an antenna of an electronic device, and a reception circuit configured to amplify a radio frequency signal received from the antenna, the communication circuit comprising:
a first amplifier configured to amplify a radio frequency signal to be transmitted through the antenna;
a first coupler connected to the first amplifier and configured to output a first amplifier output signal output from the first amplifier to the antenna through a first port of the first coupler, and output at least a part of the first amplifier output signal to a first switch through a second port of the first coupler;
the first switch connected to the second port of the first coupler and configured to switch the at least a part of the first amplifier output signal, output from the second port of the first coupler, to a second amplifier or a second switch; and
the second amplifier configured to amplify the at least a part of the first amplifier output signal, output from the first switch.

16. The communication circuit of claim 15, wherein the communication circuit is further configured to further comprise:
a second coupler connected to the second amplifier and configured to output a second amplifier output signal output from the second amplifier, through a first port of the second coupler, such that the second amplifier output signal is to be combined with the first amplifier output signal, and output at least a part of the second amplifier output signal to a second switch through a second port of the second coupler; and
the second switch provided between the first switch and the second port of the second coupler and configured to perform switching to one of an output port of the first switch and the second port of the second coupler.

17. The communication circuit of claim 16, wherein the communication circuit is further configured to:
based on the first amplifier is used, cause the first amplifier output signal output from the first amplifier to be output to an outside through the antenna, and
control the first switch and the second switch such that the at least a part of the first amplifier output signal, output from the first switch, is input as an input signal of the second switch, upon control by a processor of the electronic device.

18. The communication circuit of claim 16, wherein the communication circuit is further configured to, based on the first amplifier and the second amplifier being used:
cause the first switch to be controlled such that the at least a part of the first amplifier output signal, output from the first switch, is input as an input signal of the second amplifier, and
cause the first amplifier output signal output from the first amplifier and the second amplifier output signal output from the second amplifier to be combined with each other and output to an outside through the antenna.

19. The communication circuit of claim 16, wherein the electronic device comprises a first antenna and a second antenna, and
the communication circuit is further configured to, based on the first amplifier and the second amplifier being used, cause the first amplifier output signal output from the first amplifier to be output to an outside through the first antenna:
cause the first switch to be controlled such that the at least a part of the first amplifier output signal, output from the first switch, is input as an input signal of the second amplifier, upon control by a processor of the electronic device, and
cause the second amplifier output signal output from the second amplifier to be output to an outside through the second antenna.

20. An operation method of an electronic device, the method comprising:
monitoring a magnitude of a radio frequency signal output through an antenna of the electronic device; and
controlling a first amplifier included in a communication circuit of the electronic device to be used, or controlling the first amplifier and a second amplifier included in the communication circuit to be used, based on the magnitude of the output radio frequency signal,
wherein the communication circuit comprises:
the first amplifier configured to amplify a radio frequency signal to be transmitted through the antenna;
a first coupler connected to the first amplifier and configured to output a first amplifier output signal output from the first amplifier, to the antenna through a first port of the first coupler, and output at least a part of the first amplifier output signal to a first switch through a second port of the first coupler;
the first switch connected to the second port of the first coupler and configured to switch the at least a part of the first amplifier output signal, output from the second port of the first coupler, to a second amplifier or a second switch; and
the second amplifier configured to amplify the at least a part of the first amplifier output signal, output from the first switch, as an input signal.

* * * * *